US010636285B2

United States Patent
Haas et al.

(10) Patent No.: US 10,636,285 B2
(45) Date of Patent: *Apr. 28, 2020

(54) SENSOR INTEGRATED CIRCUITS AND METHODS FOR SAFETY CRITICAL APPLICATIONS

(71) Applicant: Allegro MicroSystems, LLC, Manchester, NH (US)

(72) Inventors: David J. Haas, Concord, NH (US); Juan Manuel Cesaretti, Ciudad de Buenas Aires (AR); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/695,698

(22) Filed: Nov. 26, 2019

(65) Prior Publication Data

US 2020/0105125 A1  Apr. 2, 2020

Related U.S. Application Data

(63) Continuation-in-part of application No. 16/444,347, filed on Jun. 18, 2019, which is a continuation of
(Continued)

(51) Int. Cl.
*G01R 35/00* (2006.01)
*G08B 29/14* (2006.01)
(Continued)

(52) U.S. Cl.
CPC ............... *G08B 29/14* (2013.01); *G01D 3/08* (2013.01); *G01R 33/0023* (2013.01);
(Continued)

(58) Field of Classification Search
CPC .... G08B 29/14; G08B 21/182; G08B 29/185; G01R 33/07; G01R 33/09; H04L 25/4902
See application file for complete search history.

(56) References Cited

U.S. PATENT DOCUMENTS 5,332,469 A   7/1994  Mastrangelo
5,465,626 A   11/1995 Brown et al.
(Continued)

FOREIGN PATENT DOCUMENTS

CN    105634361 A   6/2016
EP    0 848 489 A2  6/1998
(Continued)

OTHER PUBLICATIONS

U.S. Appl. No. 16/365,855, filed Mar. 27, 2019, Daubert et al.
(Continued)

*Primary Examiner* — Munear T Akki
(74) *Attorney, Agent, or Firm* — Daly, Crowley, Mofford & Durkee, LLP

(57) ABSTRACT

A sensor integrated circuit can include sensors with differing levels of sensitivity, a first processing channel that responds to a first analog signal generated by a first sensor to generate a first processed signal, and a second processing channel that responds to a second analog signal generated by the second sensor to generate a second processed signal. Where the first sensor can include a pressure or optical sensing element, and the second sensor can include a pressure or optical sensing element. A checker circuit uses the processed signals to detect faults in the sensor integrated circuit.

27 Claims, 12 Drawing Sheets

Related U.S. Application Data application No. 15/622,459, filed on Jun. 14, 2017, now Pat. No. 10,380,879.

(51) Int. Cl.

| | | |
|---|---|---|
| *H04L 25/49* | (2006.01) | |
| *G08B 29/18* | (2006.01) | |
| *G08B 21/18* | (2006.01) | |
| *G01R 33/07* | (2006.01) | |
| *G01R 33/00* | (2006.01) | |
| *G01D 3/08* | (2006.01) | |
| *G01R 33/09* | (2006.01) | |
| *G01R 31/28* | (2006.01) | |

(52) U.S. Cl.
CPC .............. *G01R 33/07* (2013.01); *G01R 33/09* (2013.01); *G08B 21/182* (2013.01); *G08B 29/185* (2013.01); *H04L 25/4902* (2013.01); *G01R 31/2829* (2013.01)

(56) References Cited

U.S. PATENT DOCUMENTS

| | | | |
|---|---|---|---|
| 5,592,058 A | 1/1997 | Archer et al. | |
| 5,632,854 A | 5/1997 | Mirza et al. | |
| 6,373,307 B1* | 4/2002 | Takai .................. | G11C 7/1051 327/141 |
| 6,640,643 B2 | 11/2003 | Ishio et al. | |
| 6,782,755 B2 | 8/2004 | Tai et al. | |
| 7,111,518 B1 | 9/2006 | Allen et al. | |
| 7,772,838 B2 | 8/2010 | Bailey et al. | |
| 8,280,568 B2 | 10/2012 | Nakatsu et al. | |
| 8,381,596 B2 | 2/2013 | Doering et al. | |
| 8,917,043 B2 | 12/2014 | Reynolds et al. | |
| 8,917,044 B2 | 12/2014 | Reynolds et al. | |
| 9,194,884 B1* | 11/2015 | Mossman ........... | H03F 3/45076 |
| 9,329,057 B2 | 5/2016 | Foletto et al. | |
| 9,411,023 B2 | 8/2016 | Friedrich et al. | |
| 9,780,706 B2 | 10/2017 | Allegrini et al. | |
| 10,380,879 B2 | 8/2019 | Haas et al. | |
| 2003/0001537 A1 | 1/2003 | Yang et al. | |
| 2003/0070126 A1* | 4/2003 | Werner ............ | G01R 31/31715 714/715 |
| 2003/0127289 A1 | 7/2003 | Elgas et al. | |
| 2005/0007044 A1 | 1/2005 | Qiu et al. | |
| 2006/0195720 A1* | 8/2006 | Watts .................. | H03F 1/52 714/11 |
| 2007/0001629 A1 | 1/2007 | McGarry et al. | |
| 2011/0062909 A1 | 3/2011 | Patel et al. | |
| 2012/0074972 A1 | 3/2012 | Rasbornig et al. | |
| 2012/0211299 A1 | 8/2012 | Yanai | |
| 2013/0106340 A1 | 5/2013 | Chabaud et al. | |
| 2013/0200909 A1 | 8/2013 | Rasbornig et al. | |
| 2013/0249544 A1* | 9/2013 | Vig .................... | G01R 33/0011 324/252 |
| 2014/0028237 A1 | 1/2014 | Park et al. | |
| 2014/0184200 A1* | 7/2014 | Milano ................. | G01R 33/072 324/202 |
| 2014/0285124 A1 | 9/2014 | Derammelaere et al. | |
| 2014/0333241 A1 | 11/2014 | Zhao et al. | |
| 2015/0015241 A1 | 1/2015 | Tamura | |
| 2015/0185279 A1* | 7/2015 | Milano .............. | G01R 31/2884 324/750.3 |
| 2015/0185284 A1 | 7/2015 | Milano et al. | |
| 2015/0185293 A1 | 7/2015 | Milano et al. | |
| 2015/0241523 A1 | 8/2015 | Scherr | |
| 2015/0354985 A1 | 12/2015 | Judkins, III et al. | |
| 2016/0025820 A1 | 1/2016 | Scheller et al. | |
| 2016/0139199 A1 | 5/2016 | Petrie et al. | |
| 2016/0139229 A1 | 5/2016 | Petrie et al. | |
| 2017/0052208 A1 | 2/2017 | Reddy et al. | |
| 2017/0110652 A1 | 4/2017 | Doogue et al. | |
| 2017/0346420 A1 | 11/2017 | Ross et al. | |
| 2018/0367073 A1 | 12/2018 | Haas | |
| 2019/0362619 A1 | 11/2019 | Petrie et al. | |

FOREIGN PATENT DOCUMENTS

| | | |
|---|---|---|
| JP | H 03231317 A | 10/1991 |
| JP | 2006/067667 A | 3/2006 |
| JP | 2010/045914 A | 2/2010 |
| KR | 101394556 B1 | 5/2014 |

OTHER PUBLICATIONS

U.S. Appl. No. 16/444,347, filed Jun. 18, 2019, Haas et al.
Emadi, McMaster University "Advanced Electric Drive Vehicles", 2015, 3 pages.
Extended European Search Report dated Jan. 23, 2019 for European Application No. 18192781.5; 8 Pages.
Extended European Search Report dated Oct. 4, 2018 for European Application No. 18176741.9; 7 Pages.
International Standard ISO 26262-1 "Road Vehicles—Functional Safety—Part 1 Vocabulary", Nov. 15, 2011, 30 pages.
International Standard ISO 26262-5 "Road Vehicles—Functional Safety—Part 5 Product development at the hardware level", Nov. 15, 2011, 86 pages.
International Standard ISO 26262-9 "Road Vehicles—Functional Safety—Part 9 Automotive Safety Integrity Level (ASIL)—oriented and safety-oriented analyses", Nov. 15, 2011, 24 pages.
Microchip WebSeminars "Sensorless Field Oriented Control (FOC) for Permanent Magnet Synchronous Motors (PMSM)", 51 pages.
Non-Final Office Action dated Mar. 8, 2019 for U.S. Appl. No. 15/697,846; 19 Pages.
Restriction Requirement dated Apr. 6, 2018 for U.S. Appl. No. 15/622,459, 5 pages.
Response to Restriction Requirement and Preliminary Amendment dated Jun. 1, 2018 for U.S. Appl. No. 15/622,459, 10 pages.
Office Action dated Sep. 17, 2018 for U.S. Appl. No. 15/622,459, 11 pages.
Response to Office Action filed Dec. 10, 2018 for U.S. Appl. No. 15/622,459, 14 pages.
Notice of Allowance dated Mar. 18, 2019 for U.S. Appl. No. 15/622,459; 10 pages.
Response to Office Action dated Jun. 27, 2019 for European Application No. 18176741.9; 68 pages.
Final Office Action dated Jun. 27, 2019, for U.S. Appl. No. 15/697,846; 18 pages.
Response to Final Office Action and Request for Continued Examination filed Sep. 6, 2019, for U.S. Appl. No. 15/697,846; 17 pages.
Office Action dated Oct. 2, 2019, for U.S. Appl. No. 15/697,846; 20 pages.
Response to Office Action dated Sep. 13, 2019 for European Application No. 18192781.5; 18 pages.
Office Action dated Oct. 10, 2019 for U.S. Appl. No. 16/444,347; 6 pages.
Response to Office Action dated Dec. 11, 2019 for U.S. Appl. No. 16/444,347; 10 pages.
Terminal Disclaimer dated Dec. 10, 2019 for U.S. Appl. No. 16/444,347; 3 pages.
Notice of Allowance dated Jan. 13, 2020 for U.S. Appl. No. 16/444,347; 8 pages.
Response dated Jan. 27, 2020 to Office Action for U.S. Appl. No. 15/697,846; 14 pages.

* cited by examiner

SENSOR INTEGRATED CIRCUITS AND METHODS FOR SAFETY CRITICAL APPLICATIONS

CROSS REFERENCE TO RELATED APPLICATIONS

This application is a Continuation-in-Part application and claims the benefit of U.S. patent application Ser. No. 16/444,347, filed Jun. 18, 2019, which is a Continuation application and claims the benefit of U.S. patent application Ser. No. 15/622,459, filed on Jun. 14, 2017, now U.S. Pat. No. 10,380,879 issued on Aug. 13, 2019, both of which are incorporated herein by reference.

FIELD

This disclosure relates generally to sensor integrated circuits and, more particularly, to such circuits and associated methods designed to meet strict safety requirements.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples.

Sensors are often provided in the form of integrated circuits (IC) containing one or more semiconductor die supporting electronic circuitry and optionally also containing additional elements, such as a magnet and/or passive components, such as capacitors, inductors, or resistors.

Sensor integrated circuits are widely used in automobile control systems and other safety critical applications. There are a variety of specifications that set forth requirements related to permissible sensor quality levels, failure rates, and overall functional safety. One approach to meeting such mandates has been to use redundant, identical circuits in a sensor integrated circuit.

SUMMARY

Described herein is a sensor integrated circuit that includes a substrate with a first cavity that forms a first diaphragm that can be deformed by a pressure differential across the first diaphragm, and a second cavity that forms a second diaphragm that can be deformed by a pressure differential across the second diaphragm. Included in the sensor integrated circuit is a first processing channel that can be responsive to a first analog signal to generate a first processed signal. The first analog signal can be provided by a first sensing element that is positioned adjacent to the first diaphragm and configured to detect the pressure differential across the first diaphragm by detecting deformation of the first diaphragm. Also included is a second processing channel that can be responsive to a second analog signal to generate a second processed signal. The second analog signal can be provided by a second sensing element that is positioned adjacent to the second diaphragm and configured to detect the pressure differential across the second diaphragm by detecting deformation of the second diaphragm. Included is a checker circuit that is responsive to the first processed signal and the second processed signal and that can be configured to detect a fault in the sensor integrated circuit and generate a fault signal that indicates the fault when the first processed signal and the second processed signal differ from each other by more than a predetermined amount. The checker circuit can include a first sample circuit that is configured to sample the first processed signal and generate a first sampled signal, a second sample circuit that is configured to process the second processed signal and generate a second sampled signal, and a window comparator that is responsive to the first sampled signal and the second sampled signal and configured to generate the fault signal.

The substrate of the sensor integrated circuit can include a silicon-on-insulator (SOI) wafer, a silicon wafer or a glass wafer. The width of the first diaphragm in the sensor integrated circuit can be larger than the width of the second diaphragm in the sensor integrated circuit. In some instances, the thickness of the first diaphragm can be greater than the thickness of the second diaphragm.

In embodiments, the first diaphragm and the second diaphragm can be formed within a sensor membrane. In other embodiments, the first diaphragm comprises a first material and the second diaphragm comprises a second material different from the first material. The sensor integrated circuit can include a surface micromachined pressure sensor and a bulk micromachined pressure sensor that are disposed on the sensor membrane.

In other embodiments, the sensor integrated circuit can include multiple pressure sensing elements, wherein the first cavity can include a first pressure sensing element, and the second cavity can include a second pressure sensing element. The first and second pressure sensing elements can include magnetic field sensing elements, where the strength of the magnetic field detected by the first sensing element can change according to a deformation of the first diaphragm and the strength of the magnetic field detected by the second element can change according to a deformation of the second diaphragm. The sensor integrated circuit can include a ferromagnetic material that can be adjacent to the first diaphragm and the second diaphragm and can include one of a back-bias magnet, permanent magnet or coil adjacent to the magnetic field sensing elements. The first and second pressure sensing elements can include capacitive sensing elements such that an amount of capacitance that is detected by the first sensing element can change according to a deformation of the first diaphragm and an amount of capacitance detected by the second element can change according to a deformation of the second diaphragm.

In some instances, the sensor integrated circuit can include multiple pressure sensing electrodes such that the first cavity can include a first pair of pressure sensing electrodes, and the second cavity can include a second pair of pressure sensing electrodes. The first pair of pressure sensing electrodes and the second pair of pressure sensing electrodes can be piezoelectric sensors that can include piezoresistors or piezotransistors.

In still other instances, the sensor integrated circuit can include first and second pressure sensing elements that include piezoelectric sensing elements where an amount of voltage detected by the first sensing element changes according to a deformation of the first diaphragm and an amount of voltage detected by the second element changes according to a deformation of the second diaphragm.

The sensor integrated circuit can include a magnetic element that is disposed in the first diaphragm and the second diaphragm, where this magnetic element can be a hard ferromagnetic material or a soft ferromagnetic material. In other instances, the first processing channel can have a first accuracy and the second processing channel can have a second accuracy different than the first accuracy. In still other instances, the substrate can be further configured to support the first sensing element and the second sensing element.

In embodiments, the substrate can be further configured to support the first sensing element, and a second substrate separate from the substrate supporting the first sensing element, the second substrate configured to support the second sensing element. In some instances, the substrate can be configured to support the first processing channel, the second processing channel and the checker circuit.

In other embodiments, the substrate can be formed either using a deep reactive ion etching process or an isotropic silicon wet etch process.

Also described is a sensor integrated circuit that can include a first processing channel that can be responsive to a first analog signal to generate a first processed signal, wherein the first analog signal can be provided by a first semiconductor structure configured to detect incident photons. The sensor integrated circuit can include a second processing channel that is responsive to a second analog signal to generate a second processed signal, wherein the second analog signal can be provided by a second semiconductor structure configured to detect incident photons. The sensor integrated circuit can also include a checker circuit that can be responsive to the first processed signal and the second processed signal and configured to detect a fault in the sensor integrated circuit and generate a fault signal indicative of the fault when the first processed signal and the second processed signal differ from each other by more than a predetermined amount. The checker circuit can include a first sample circuit configured to sample the first processed signal and generate a first sampled signal, a second sample circuit configured to process the second processed signal and generate a second sampled signal, and a window comparator responsive to the first sampled signal and the second sampled signal and configured to generate the fault signal.

In some instances, the first semiconductor structure can include a first material and the second semiconductor structure can include a second material, wherein the first material is different from the second material.

In other instances, the first semiconductor structure can have a first surface area and the second semiconductor structure can have a second surface area, wherein the first surface area is greater than the second surface area.

In still other instances, the substrate can be configured to support the first semiconductor structure and the second semiconductor structure.

The sensor integrated circuit can include a first substrate that can be configured to support the first semiconductor structure, the first processing channel, the second processing channel and the checker circuit, and a second substrate that can be configured to support the second semiconductor structure.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
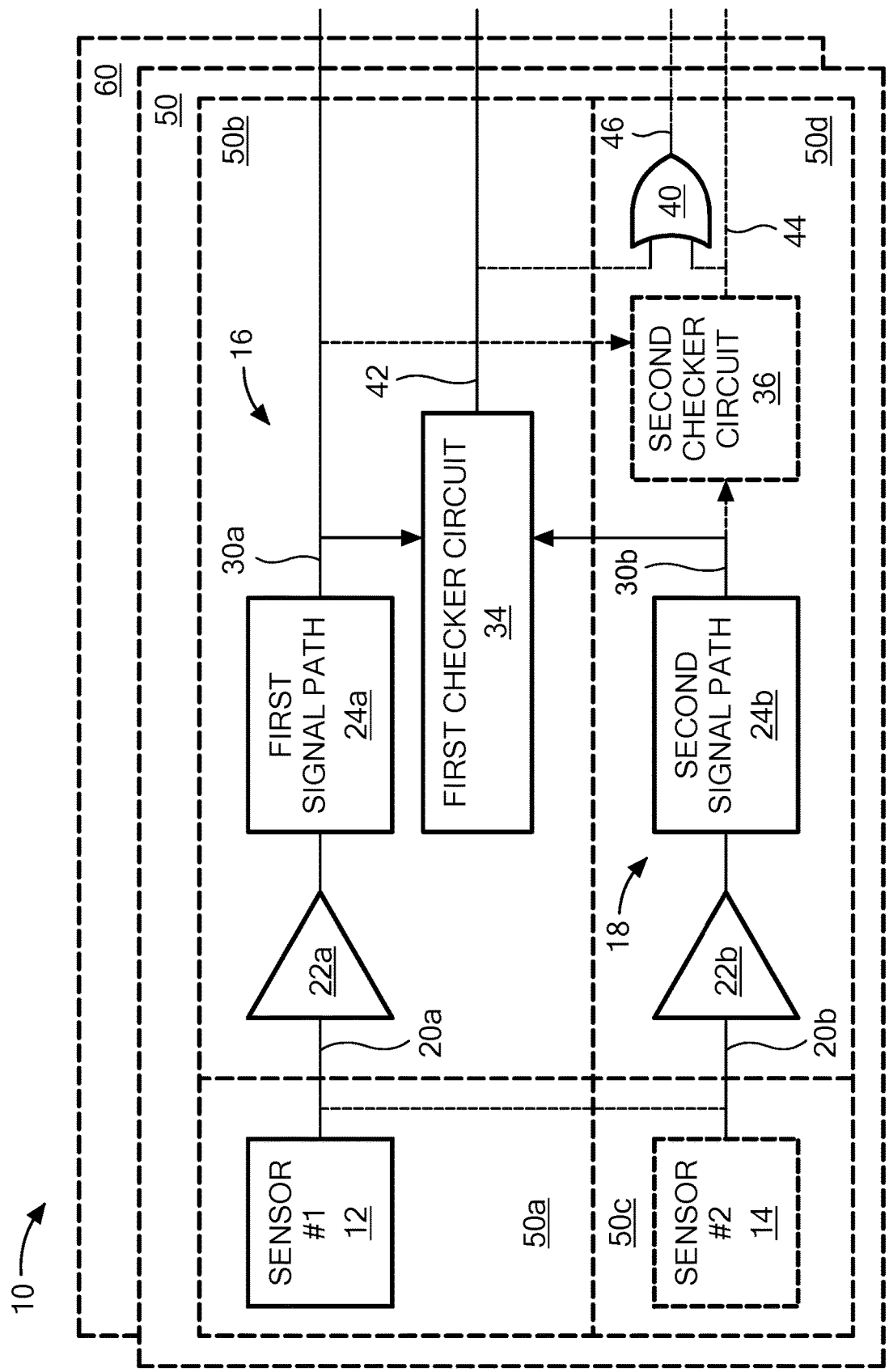
FIG. 1 is a block diagram of a sensor integrated circuit including non-homogenous processing channels.

Referring to FIG. 1, a sensor integrated circuit (IC) 10 includes a first processing channel 16 responsive to a first analog signal 20a to generate with a first accuracy a first processed signal 30a and a second processing channel 18 responsive to a second analog signal 20b to generate with a second accuracy a second processed signal 30b. The second accuracy of the second processing channel 18 is different than the first accuracy of the first processing channel 16. A checker circuit, or error detector 34 is responsive to the first processed signal 30a and the second processed signal 30b and is configured to detect a fault in the sensor IC 10 when the first processed signal 30a and the second processed signal 30b differ from each other by more than a predetermined amount.

The first and second processing channels 16, 18 each are designed to sense an external parameter by processing analog signals 20a, 20b to provide a respective processed signal 30a, 30b indicative of the sensed parameter. In embodiments, the first processing channel 16 may be referred to as a primary processing channel designed to meet a more demanding set of requirements (e.g., a faster processing speed and/or accuracy) and the second processing channel 18 may be referred to as a secondary processing channel designed to meet less demanding requirements, but still sufficient to achieve operational redundancy to meet the applicable safety standards. The processed signals 30a, 30b differing from each other by more than a predetermined amount (as determined by the checker circuit 34) provides an indication that a fault has occurred within the sensor IC 10.

More generally, a high level of safety standard compliance can be achieved by using two unique (i.e., non-homogenous) processing channels 16, 18 and a checker circuit 34 to compare the outputs of the two channels. What is meant by "non-homogenous" processing channels 16, 18 is that the channels differ from each other in at least one way. Examples of non-homogeneities between the processing channels 16, 18 include providing the processing channels with different accuracies, providing the processing channels with one or more different types of circuit elements and/or circuitry, providing different analog input signals to each processing channel, and/or by implementing different sensing methodologies in the processing channels. Furthermore, the processing channels can have more than one non-homogeneity with respect to each other. Specific examples of types of processing channel non-homogeneities will be described below.

Some safety standards specify different fault performance requirements for different types of faults, such as single point faults and latent faults. Additionally, certain applications may require different fault reporting time (sometimes referred to as fault tolerant time) within which a fault must be deleted by the sensor. Non-homogeneous processing channels 16, 18 may have different processing accuracies and still meet fault performance requirements. For example, the primary processing channel 16 can implement more accurate sensing than the secondary processing channel 18. It will be appreciated that even with one or more non-homogeneities between the processing channels 16, 18, the channels can be designed to have the same or different accuracies to generate the respective first and second processed signals 30a, 30b.

Each processing channel 16, 18 includes at least a respective signal path, such as first signal path 24a in processing channel 16 and second signal path 24b in the second processing channel 18. Processing channels 16, 18 may additionally include a respective amplifier 22a, 22b, as shown.

Each processing channel 16, 18 is responsive to an analog signal that is generated by a sensing element or a plurality of sensing elements, here illustrated as sensors 12, 14. In some embodiments, each processing channel 16, 18 is responsive to a respective analog signal 20a, 20b generated by a respective sensor 12, 14 and, in other embodiments, each processing channel 16, 18 is responsive to the same analog signal (e.g., signal 20a) generated by the same sensor 12. One example application in which the processing channels 16, 18 may respond to the same analog signal is a three-phase motor controller in which the sensor providing the analog signal to both processing channels is a shunt resistor configured to measure the phase current. The sensor(s) 12, 14 can form part of (i.e., be integrated with or internal to) the sensor IC 10 or, alternatively, can be external to the sensor IC 10, as will be explained.

In general, the sensors 12, 14 include one or more sensing elements to sense an external parameter. As examples, in some embodiments, sensors 12, 14 include one or more magnetic field sensing elements, or transducers to sense a magnetic field, such as a magnetic field as may be affected by movement of a target object or as may result from a current flow through a conductor. Other types of devices may provide the sensing element(s). For example, the sensor(s) may comprise a resistor, as may be configured to generate a voltage signal indicative of a current flow, an optical sensing element, or a pressure sensing element.

The sensor IC 10 responding to analog signals generated by such sensors 12, 14 can be used in a variety of applications including, but not limited to, an angle sensor that senses an angle of a direction of a magnetic field, a current sensor that senses a magnetic field generated by a current through a conductor, a magnetic switch that senses the proximity of a an object, a rotation detector that senses features of a rotating object, for example, magnetic domains of a ring magnet or a ferromagnetic target (e.g., gear teeth) where the magnetic field sensor is used in combination with a back-biased or other magnet, a linear magnetic field sensor that senses a magnetic field density of a magnetic field, a pressure sensor, an optical detector, and motor control circuits.

In embodiments in which the sensors 12, 14 contain one or more magnetic field sensing elements, such elements can be, but are not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR, including spin-valve structures) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Sensor IC 10 generates one or more output signals. For example, one or both of the first processed signal 30a from the first signal path 24a and the second processed signal 30b from the second signal path 24b may be provided to circuits and systems external to the IC 10 in order to thereby provide an indication of the parameter sensed by sensors 12, 14. Additionally, the checker circuit 34 may provide a fault signal 42 which may be coupled to external circuits and systems for further processing or action. In some embodiments, the fault signal 42 from the checker circuit 34 may be combined with the first and/or second processed signals 30a, 30b in order to provide a "composite" output signal, or signals that conveys information about the parameter sensed by the sensor IC10 as well as fault information.

The particular signal processing functionality of the primary and secondary processing channels 16, 18 used to generate the sensor IC output signals depends on the sensed parameter and purpose of the IC 10. For example, in embodiments in which the sensor IC 10 forms a current sensor, the processing channels 16, 18 may amplify an analog voltage signal generated by a sensor in the form of one or more magnetic field sensing elements or resistors, which analog voltage signal has a magnitude indicative of a level of a current through a conductor, as will be described in connection with the example embodiment of FIG. 1A. As another example, in embodiments in which the sensor IC 10 forms an angle sensor, the processing channels 16, 18 may respond to analog signals from one or more magnetic field sensing elements and may compute an arctangent of a digitized version of the magnetic field signals in order to thereby determine the angle of the magnetic field, as will be described in connection with the example embodiment of FIG. 1B.

The above-described arrangements can be provided with various options in order to suit a particular application and/or safety requirements. Optional elements and connections are illustrated in the figures by certain dotted line connections and element outlines.

In some embodiments, the sensor IC 10 additionally includes a second checker circuit 36. The second checker circuit 36, like the first checker circuit 34, is responsive to the first processed signal 30a and the second processed signal 30b and is configured to detect a fault in the sensor IC 10 when the first processed signal 30a and the second processed signal 30b differ from each other by more than a predetermined amount. The fault signal 44 generated by the second checker circuit 36 can be provided as an output signal of the IC 10 to external circuits and/or systems.

In some embodiments utilizing both first and second checker circuits 34, 36, the fault signals 42, 44 generated by each checker circuit can be coupled to a logic circuit (here, logic or gate 40) to thereby generate a fault signal 46 indicative of a fault in the sensor IC 10 when either fault signal 42 or fault signal 44 indicates a fault condition in the sensor IC. In such embodiments, the output signal 46 of logic circuit 40 can be provided as a further (or alternative) output signal of the IC 10 to external circuits and/or systems. Furthermore, the first and second checker circuits 34, 36 can be identical or can be non-homogenous checker circuits.

The sensor IC 10 generally includes one or more semiconductor die supporting electronic circuitry, a lead frame having a plurality of leads through which electrical connections can be made to the IC circuitry from outside of the IC and may optionally include additional discrete components. Portions of the IC 10, including at least the semiconductor die and a portion of the lead frame, are enclosed by a non-conductive mold material that forms the IC package, while other portions (such as connection portions of leads) are not enclosed by the mold material and permit access to connection points within the IC.

Dotted line boxes 50, 50a, 50b, 50c, and 50d, and 60 represent possible individual semiconductor die within the sensor IC package. As noted above, the sensor(s) 12, 14 may be internal to the sensor IC 10 or, alternatively, may be external to the IC. Many variations are possible in terms of partitioning of the described circuitry on one or more die and which variation is adopted generally will be based on safety requirements and space and cost considerations.

In some embodiments, the IC 10 contains only a single semiconductor die (here including boxes 50b and 50d) supporting the first processing channel 16, the second processing channel 18, and the checker circuit 34. In such single die embodiments in which one or both sensors 12, 14 are internal to the IC, the single die can additionally support sensors 12, 14, in which case such single die can represented by box 50.

In other embodiments, the IC 10 can contain multiple semiconductor die, each supporting a portion of the circuitry and provided in the same package as the other die. Considering first multi-die embodiments in which the sensor(s) 12, 14 are external to the IC 10, one such example embodiment has the first processing channel 16 and the first checker circuit 34 supported by a first die 50b and the second processing channel 18, the second checker circuit 36, and logic circuit 40 supported by a second die 50d. In multi-die embodiments in which the sensor(s) 12, 14 are contained within the IC 10, one such example embodiment has the first sensor 12, first processing channel 16, and the first checker circuit 34 supported by a first die represented by boxes 50a and 50b and the second sensor 14, second processing channel 18, the second checker circuit 36, and logic circuit 40 supported by a second die represented by boxes 50c and 50d. It will be appreciated that the particular partitioning of circuitry amongst multiple semiconductor die can be varied.

In some embodiments, it may be desirable to provide additional redundancy by duplicating the above-described circuitry shown within box 50 or within boxes 50b, 50c. In one such example, the sensor IC 10 contains all the circuitry within box 50 and a duplicate of such circuitry within identical box 60. More particularly, in one such example of this type, a first semiconductor die 50 can support the first sensor 12, the second sensor 14, the first processing channel 16, the second processing channel 18, and the checker circuit 34. A second semiconductor die (within the same IC package) as may be represented by box 60 can support a third sensor that is the same as or similar to the first sensor 12, a fourth sensor that is the same as or similar to the second sensor 14, a third processing channel that is the same as or similar to the first processing channel 16, and a fourth processing channel that is the same as or similar to the second processing channel 18, and a checker circuit that is the same as or similar to the checker circuit 34. With this arrangement, an additional level of redundancy and safety integrity can be achieved since the fault signals from the two identical die will provide an indication of which die can be "trusted" to provide the IC output. In other words, if the checker circuit from one die indicates a fault and the checker circuit from the other die does not indicate a fault, then system operation can continue on the basis of the output signal from the die on which no fault is detected.

Figure 1A:
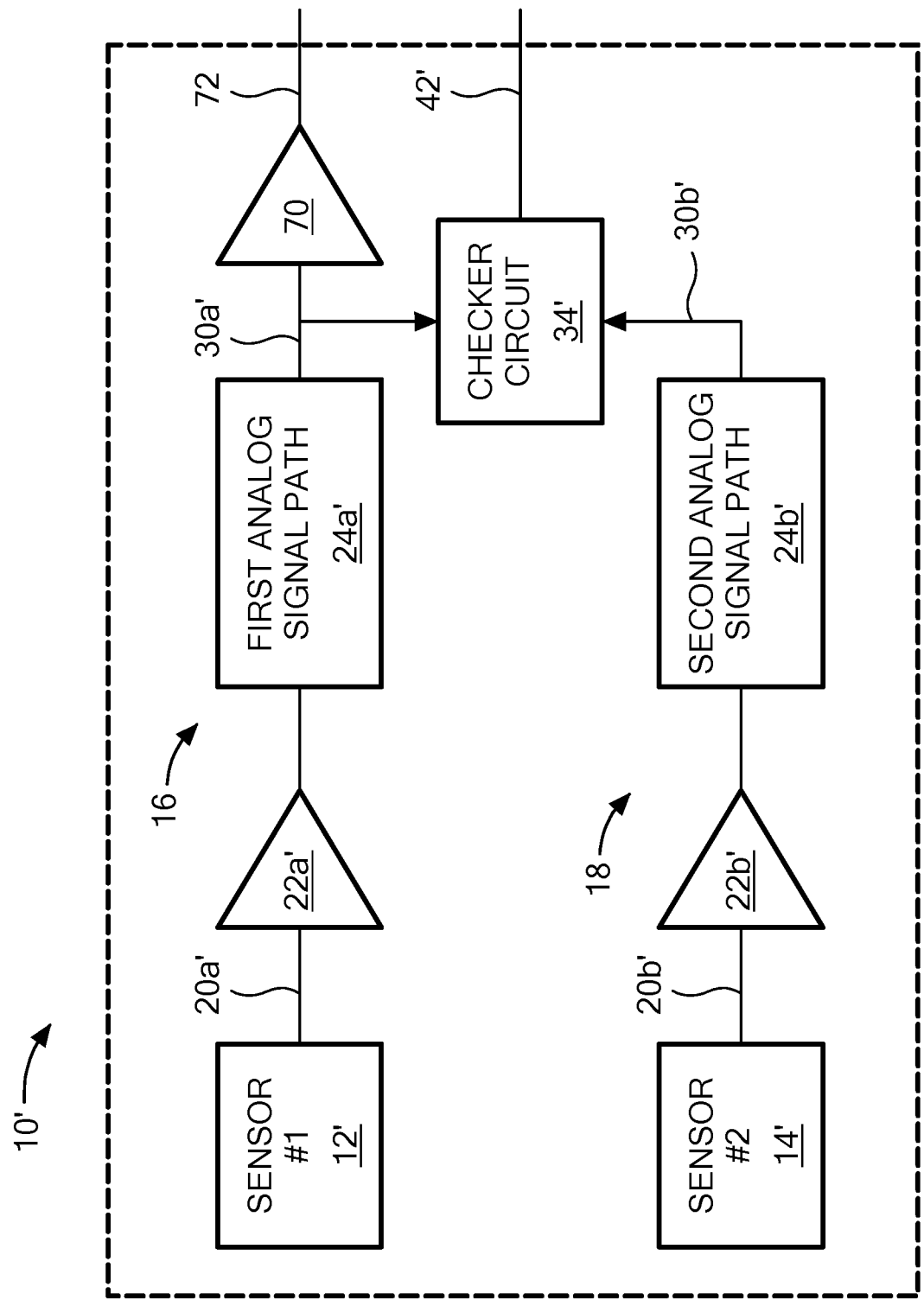
FIG. 1A is a block diagram of an example analog sensor integrated circuit.

Referring to FIG. 1A, an example sensor IC 10' is provided in the form of an analog sensor, such as a linear magnetic field sensor or a current sensor. In an embodiment, sensor 12' comprises one or more magnetoresistance elements, such as a GMR element, and sensor 14' comprises one or more Hall effect elements, such as a vertical Hall element. Each sensor 12', 14' generates a respective analog magnetic field sensing signal 20a', 20b' for coupling to a respective processing channel 16', 18'. For example, each such magnetic field signal 20a', 20b' may take the form of a substantially sinusoidal signal generated in response to a magnetic field, such as a magnetic field generated by a current flow through a proximate conductor (not shown).

Primary processing channel 16' includes an amplifier 22a' and a first signal path 24a' and secondary processing channel 18' includes an amplifier 22b' and a second signal path 24b'. In an embodiment, each of the signal paths 24a', 24b' takes the form of an analog filter. For example, signal path 24a' may be a switched capacitor filter and signal path 24b' may be an RC filter. Thus, a first processed signal 30a' generated by the first signal path 24a' may be an analog filtered signal and the second processed signal 30b' generated by the second signal path 24b' may be an analog filtered signal but filtered with a different filter type than the first processed signal 30a'.

A buffer 70 coupled to the output of the first analog signal path 24a' provides a sensor output signal 72 as may be coupled to circuits and systems external to the sensor IC 10'. Thus, in this example, the magnetic field detected by GMR sensor 12' is filtered by signal path 24' to provide the sensor IC output signal 72.

The second processing channel 18' is provided for non-homogenous redundancy in order to permit detection of a fault in the first processing channel 16'. It will be appreciated however, that the processed signal 30b' also could be provided to circuits and systems external to the sensor IC 10' in order to thereby provide redundant output signals.

Figure 2:
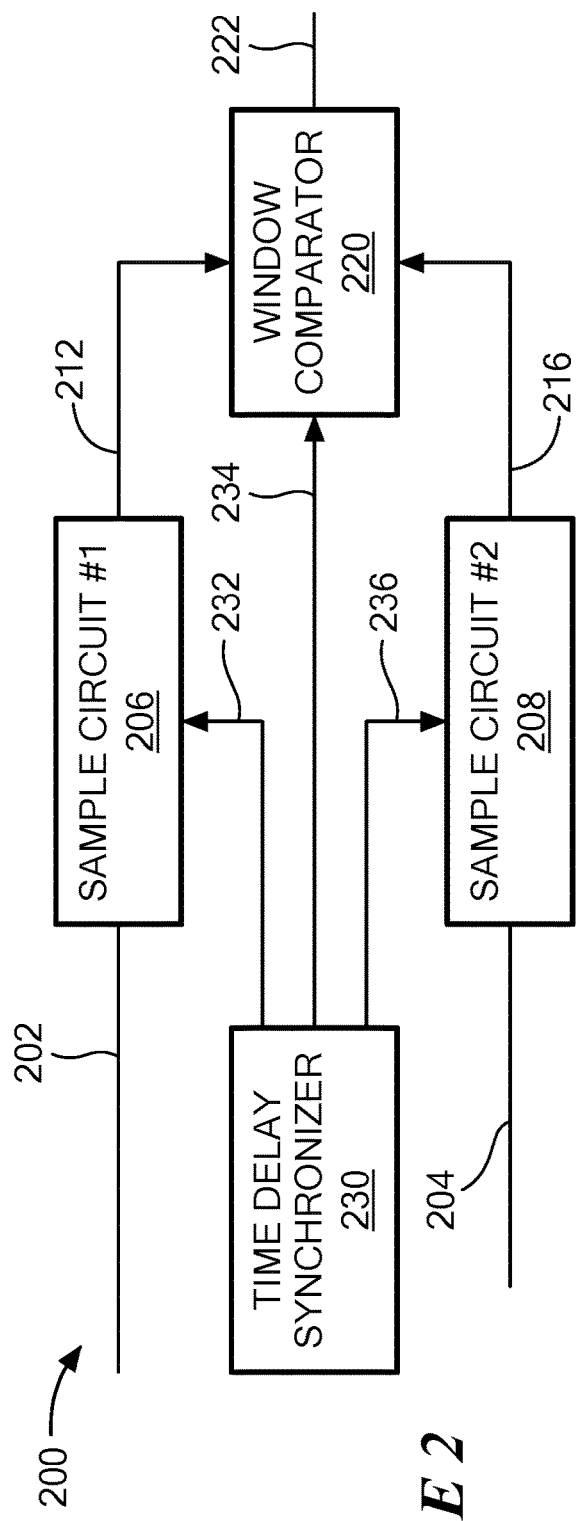
FIG. 2 is a block diagram of an example checker circuit.

The checker circuit 34' has inputs coupled to receive the first processed signal 30a' and the second processed signal 30b' and generates fault signal 42' at an output, as shown. Various types of checker circuits are possible. A suitable example analog checker circuit 34' for the analog sensor IC 10" is shown in FIG. 2 and described below. Suffice it to say here that the checker circuit 34' performs a comparison of the first processed signal 30a' and the second processed signal 30b' and generates the fault signal 42' indicative of a fault in the sensor IC if the signals 30a', 30b' differ by more than a predetermined amount. It will be appreciated that while the analog sensor IC 10' of FIG. 1A includes only one checker circuit 34', a second checker circuit (e.g., checker circuit 36 of FIG. 1) could be provided.

Sensor 10' is an example of a sensor in which processing channels 16 and 18 differ in a more than one way (i.e., have more than one non-homogeneity). In particular, the first processing channel 16 contains a different circuit type than the second processing channel 18 (i.e., switched capacitor filter 24a' is different than RC filter 24b'). Additionally, the first processing channel 16' is responsive to an analog signal 20a' from a first sensor type (e.g., a GMR element) and the second processing channel 18' is responsive to an analog signal 20b' from a second sensor type, different than the first sensor type (e.g., a vertical Hall effect element).

Figure 1B:
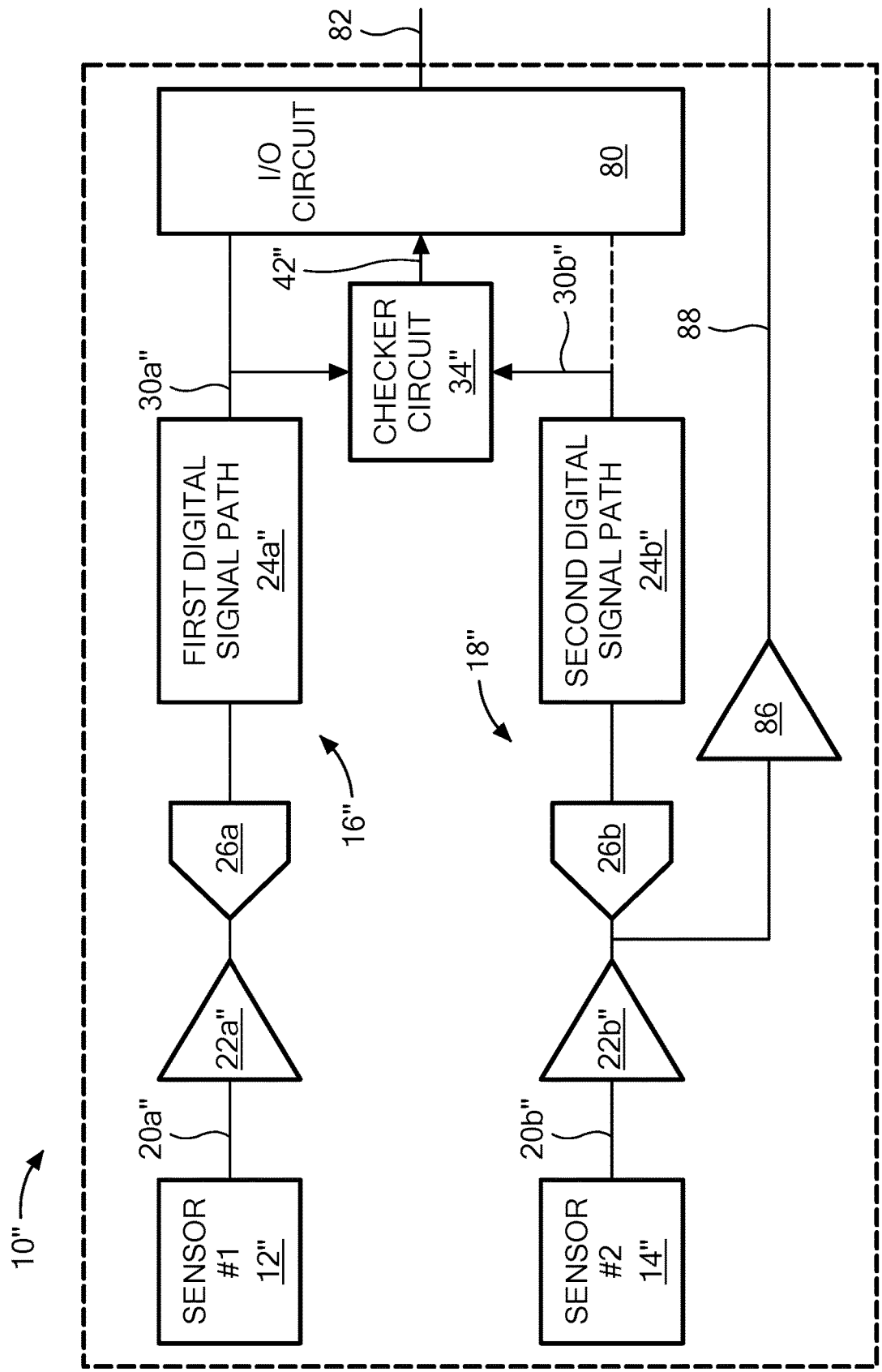
FIG. 1B is a block diagram of an example digital sensor integrated circuit.

Referring to FIG. 1B, an example sensor IC 10" is provided with digital signal paths 24a" and 24b". Digital sensor IC 10" may take various forms to perform signal processing functionality on analog input signals 20a", 20b" from sensors 12", 14", as shown. As examples, sensor IC 10" may be an angle sensor to sense the angle of a magnetic field direction, a speed sensor to sense a speed of movement such as rotation of a target object, or a motor controller configured to sense motor phase current.

In an embodiment, sensor IC 10" is an angle sensor and sensor 12" comprises a Circular Vertical Hall (CVH) element and sensor 14" comprises one or more planar Hall effect elements, as will be explained in connection with FIGS. 4 and 4A. Each sensor 12", 14" generates a respective magnetic field sensing signal 20a", 20b" for coupling to a respective processing channel 16", 18". For example, each such magnetic field signal 20a", 20b" may take the form of a substantially sinusoidal signal as may be generated in response to a magnetic field, the angle of which is to be determined.

Processing channel 16" includes an amplifier 22a", an analog-to-digital converter (ADC) 26a, and a first digital signal path 24a". Processing channel 18" includes an amplifier 22b", an ADC 26b, and a second digital signal path 24b". More particularly, the first digital signal path 24a" is coupled to receive a digital output signal from ADC 26a and generates the first processed signal 30a" and the second digital signal path 24b is coupled to receive a digital output signal from ADC 26b and generates the second processed signal 30b".

Figure 3:
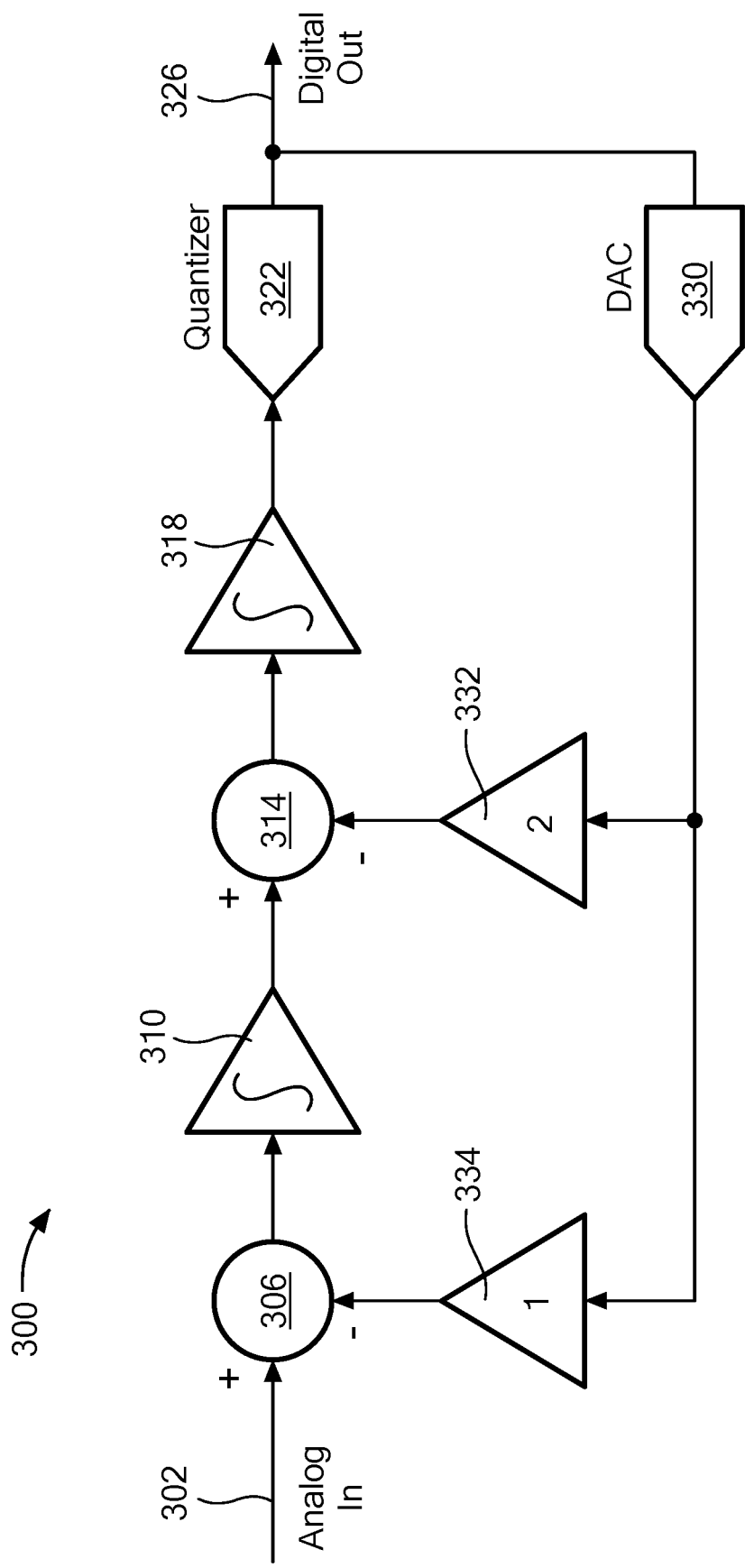
FIG. 3 is a schematic of an example analog-to digital converter.
Figure 3A:
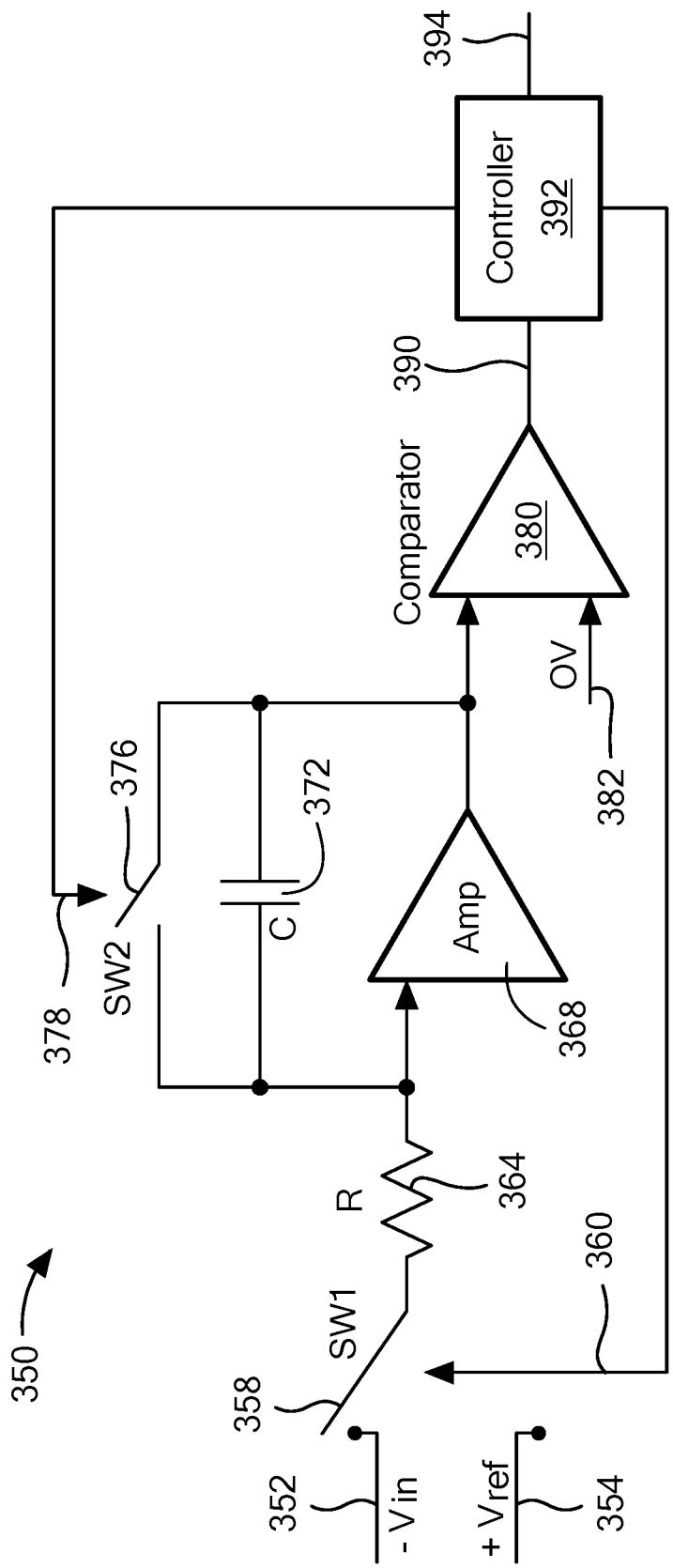
FIG. 3A is a schematic of an alternative analog-to digital converter.

Each processing channel 16", 18" may include a different type of ADC 26a, 26b. For example, ADC 26a may take the form of a sigma-delta ADC as shown in FIG. 3 and ADC 26b may take the form of a dual slope ADC as shown in FIG. 3A, both of which are described below. In this example embodiment, ADC 26a may have a faster data conversion rate than ADC 26b. Other types of ADCs are also possible, such as successive approximation ADCs for example.

Each of the digital signal paths 24a", 24b" may implement a different sensing methodology to process the input digital magnetic field signal samples and generate a respective processed signal 30a", 30b" indicative of the angle of the sensed magnetic field. In an embodiment, the first digital signal path 24a" processing the CVH generated magnetic field signal 20a" includes a zero crossing detector such as that shown in FIG. 4 and the second digital signal path 24b" processing orthogonal magnetic field signal generated by respective orthogonally positioned vertical Hall effect elements includes a CORDIC processor such as that shown in FIG. 4A, both of which are described below. Other types of sensing methodologies may be used to generate a processed signal indicative of the angle of the sensed magnetic field, such as methodologies including the use of a Phase Locked Loop (PLL).

Figure 2A:
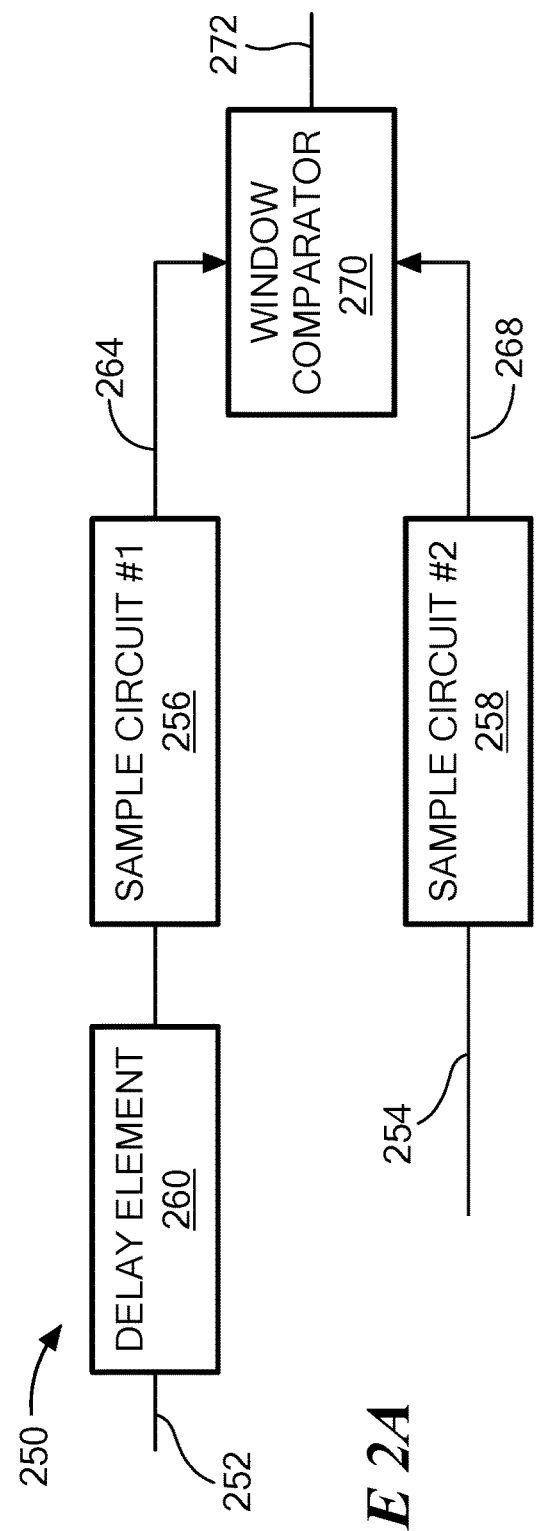
FIG. 2A is a block diagram of an alternative checker circuit.

The checker circuit 34" has inputs coupled to receive the first processed signal 30a" and the second processed signal 30b" and generates fault signal 42" at an output, as shown. Various types of checker circuits are possible. A suitable example digital checker circuit 34" for the digital sensor IC 10" is shown in FIG. 2A and described below. Suffice it to say here that the checker circuit 34" performs a comparison of the first processed signal 30a" and the second processed signal 30b" and generates the fault signal 42" indicative of a fault in the sensor IC if the signals 30a", 30b" differ by more than a predetermined amount. It will be appreciated that while the digital sensor IC 10" of FIG. 1B includes only one checker circuit 34", a second checker circuit (e.g., checker circuit 36 of FIG. 1) could be provided.

The fault signal 42" and each of the first and second processed signals 30a", 30b" are coupled to an Input/Output (I/O) circuit 80, which circuit provides an output signal 82 of the sensor, as shown. The I/O circuit 80 may include a digital register configured to provide the sensor output signal 82 in a format compatible with the external circuits or systems. As examples, the sensor output signal 82 can provide the sensed magnetic field angle from signals 30a" and/or 30b" and fault information encoded in various known communication formats or protocols, including Controller Area Network (CAN), Single Edge Nibble Transmission (SENT), Manchester, Serial Peripheral Interface (SPI), Inter-Integrated Circuit (I²C), etc. More particularly, the sensor output signal 82 can be a composite output signal, such a digital word that conveys information about the parameter sensed by the sensor(s) as well as fault information.

Figure 1C:
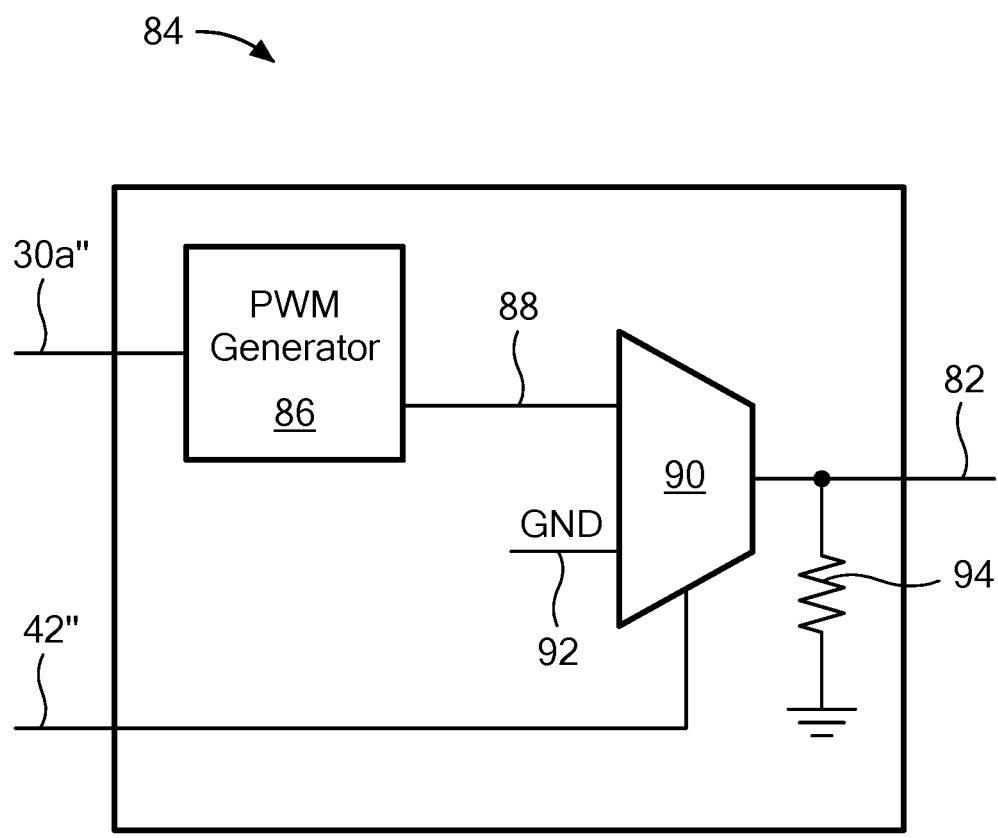
FIG. 1C is a block diagram of an example I/O circuit configuration for the digital sensor integrated circuit of FIG. 1B.

Referring also to FIG. 1C, an example I/O circuit 84 as may provide the I/O circuit 80 in FIG. 1B is configured to generate sensor output signal 82 with a PWM signal format. I/O circuit 84 includes a PWM generator 86, a multiplexer 90, and a pull-down resistor 94. More particularly, the processed signal 30a" from the primary processing channel 16" is coupled to the PWM generator 102, which generator generates a PWM output signal 82 (i.e., a digital pulse train or square wave signal) having a duty cycle that varies according to the value of the digital processed signal 30a".

The fault output signal 42" (FIG. 1B) of the checker circuit 34" controls the multiplexer 90 so that, depending on the state of the fault output signal 42", the multiplexer 90 couples either the PWM generator output signal 88 or a reference signal, such as ground 92 to the sensor IC output 82. More particularly, if the fault signal 42" is at a level indicative of an IC fault, then the sensor output 82 can be coupled to ground; whereas, if the fault signal 42" is at a level not indicating the existence of a fault, then the PWM generator output signal 88 can be coupled to the sensor output 82. Pull-down resistor 94 has a high enough impedance so as not to interfere with normal operation such that when the PWM signal 88 is active and is coupled to the sensor output 82, the PWM signal 88 provides the sensor output signal 82.

With this arrangement, the absence of a PWM signal at the sensor output 82 can be interpreted to indicate the existence of a fault other than a fault due to the processed signals 30a", 30b" differing by more than the predetermined amount. As one example, if an internal regulator within the IC 10" were to fail, then conceivably both signal paths 16", 18" and the checker circuit 34" would fail. In this scenario, even though the checker circuit 34" is no longer functional to provide a fault indicator or flag, the pull-down resistor 94 would keep the sensor IC output 82 low, thereby permitting the absence of the PWM output signal to occur under additional conditions beyond just the fault condition flagged by the fault signal 42".

Sensor 10" is an example sensor in which processing channels 16" and 18" differ in a more than one way (i.e., have more than one non-homogeneity). In particular, the first processing channel 16" contains a different circuit type than the second processing channel 18" (i.e., sigma-delta ADC 26a is different than dual slope ADC 26b) is shown. Additionally, the first processing channel 16" is responsive to an analog signal 20a" from a first sensor type (e.g., a CVH element) and the second processing channel 18" is responsive to an analog signal 20b" from a second sensor type, different than the first sensor type (e.g., a vertical Hall effect element). Furthermore, each processing channel 16", 18" implements a different sensing methodology (i.e., digital signal path 24a" uses zero crossing detection to determine magnetic field angle and digital signal path 24b" uses arctangent computation with a CORDIC processor).

As noted above, the digital sensor IC 10" could take the form of a speed sensor. For example, in embodiments, the first digital signal path 24a" and the second digital signal path 24b" can include different types of peak detectors (e.g., a so-called peak-to-peak percentage detector, a peak-referenced detector, or a threshold detector). In this example, each of the processed signals 30a", 30b" may take the form of a digital pulse train with a period indicative of the speed of a target.

Example checker circuits are shown in FIGS. 2 and 2A. Since the processing channels 16, 18 are non-homogenous and may have different accuracies which, in some embodiments can result in processed signals 30a, 30b having different speeds, the checker circuit 34 is configured to address such channel mismatches in order to permit accurate comparison of the processed signals. As will become apparent, the checker circuit 200 of FIG. 2 addresses channel mismatches essentially by "waiting" for the slower channel before sampling and the checker circuit 250 of FIG. 2A addresses channel mismatches essentially by "delaying" the faster channel before sampling.

Referring to FIG. 2, an example checker circuit 200 includes a first sample circuit 206, a second sample circuit 208, a time delay synchronizer 230, and a window comparator 220. The checker circuit 200 is responsive to input signals 202, 204 (which may be the same as or similar to analog processed signals 30a', 30b' of FIG. 1A or to digital processed signals 30a", 30b" of FIG. 1B) and is configured to generate an output signal 222 (which may be the same as or similar to fault signal 42' of FIG. 1A or to fault signal 42" of FIG. 1B).

Sample circuit 206 samples input signal 202 to provide sampled signal 212 to an input of the window comparator 220 and sample circuit 208 samples the input signal 204 to provide sampled signal 216 to an input of the window comparator 220. In embodiments in which the checker circuit 200 is provided in an analog sensor IC (e.g., IC 10' of FIG. 1A), sample circuits 206, 208 may comprise sample and hold circuits, as may include a switch and capacitor whereby charge from the analog input signal is selectively stored on the capacitor when the switch is closed and held on the capacitor when the switch is open. In embodiments in which the checker circuit 200 is provided in a digital sensor IC (e.g., IC 10" of FIG. 1B), sample circuits 206, 208 may comprise a digital register or other suitable digital storage.

The time delay synchronizer 230 generates one or more synchronizing, or clock signals, here signals 232, 234, 236, for coupling to an input of sample circuits 206, 208, and also to an input of the window comparator 220, as shown. As noted above, the processed signals providing checker input signals 202, 204 (e.g., processed signals 30a', 30b' of FIG. 1A or processed signals 30a", 30b" of FIG. 1B) may result from different processing speeds and thus, may themselves have different speed characteristics. Accordingly, the synchronizing signals 232, 236 control the respective sample circuits 206, 208 (e.g., control respective switches in the sample and hold circuits) in order to ensure that the sampled signals 212, 216 have the same speed for comparison by window comparator 220. For example, if input signal 202 has a speed twice as fast as input signal 204, synchronizing signal 236 may control sample circuit 208 to sample input signal 202 twice as fast as synchronizing signal 232 controls sample circuit 206 to sample input signal 204 in order to thereby generate sampled signals 212, 216 with the same speed. Synchronizing signal 234 is coupled to the window comparator 220 and controls the time of comparison between the sampled signals 212, 216.

Window comparator 220 is configured to compare the sampled signals 212, 216 and to generate fault signal 222 to indicate a fault if the signals 212, 216 differ by more than a predetermined amount. In this configuration, one of the sampled signals 212, 216 provides the comparator threshold voltage and the other sampled signal provides the comparator input. With this configuration, the comparator output signal 222 is provided in a first logic state when the difference between the first and second sampled signals 212, 216 is less than a predetermined amount, as may be established by a resistor divider within the window comparator, and is in a second logic state when the difference between the first and second sampled signals 212, 216 is greater than the predetermined amount. In embodiments, the predetermined amount may be specified in terms of an absolute acceptable variation of the sensor output (e.g., in an angle sensor, the predetermined amount may correspond to a magnetic field angle error of 10° for example). In some embodiments, the predetermined amount can be a percentage difference (e.g., in an angle sensor, the predetermined amount can correspond to the sensor output being within 5% of the actual magnetic field angle). The predetermined amount can also be a programmable or selectable value.

It will be appreciated that the fault signal 222 can take various forms, such as a logic signal having levels as set forth above depending on the difference between the first and second sampled signals 212, 216. As an alternative for example, the fault signal 222 can take the form of a flag that is set when the difference between the sampled signals 212, 216 differs by the predetermined amount and is not cleared until some system function occurs or until cleared by a system processor, for example.

Referring to FIG. 2A, an alternative checker circuit 250 includes a first sample circuit 256, a second sample circuit 258, a delay element 260, and a window comparator 270. The checker circuit 250 is responsive to input signals 252, 254 (which may be the same as or similar to analog processed signals 30a', 30b' of FIG. 1A or to digital processed signals 30a", 30b" of FIG. 1B) and is configured to generate an output signal 272 (which may be the same as or similar to fault signal 42' of FIG. 1A or to fault signal 42" of FIG. 1B).

Delay element 260 is coupled in series between input signal 252 and sample circuit 256 in order to delay such input signal for sampling by sample circuit 256. In embodiments in which checker circuit 250 provides the checker circuit 34' (FIG. 1A) for example, such that input signals 252, 254 are provided by processed signals 30a', 30b', respectively, the processed signal 30a' can be delayed so as to provide a signal with the same speed as input signal 30b' for further processing. For example, if input signal 252 has a speed twice as fast as input signal 254, then delay element 260 can delay input signal 252 so as to have the same speed as the input signal 254. Thus, it is contemplated that the delay element 260 is provided in series with the faster of the two processing channels. In embodiments, an Exclusive-OR (XOR) logic circuit can be provided to effectively couple the delay element 260 in series with a selected (i.e., faster) one of the processing channels.

It will be appreciated that in some embodiments, a second delay element (not shown) additionally may be provided in series with the slower processing channel in order to permit adjustment of the slower processed signal as well, in order to thereby generate input signals for sample circuits 256, 258 that have approximately the same speed for subsequent sampling.

Sample circuits 256, 258 can be the same as or similar to sample circuits 206, 208 so as to provide respective sampled signals 264, 268 for coupling to inputs of window comparator 270, as shown. Thus, in embodiments in which the checker circuit 250 forms part of an analog sensor IC (e.g., IC 10' of FIG. 1A), sample circuits 256, 258 may comprise sample and hold circuits and, in embodiments in which the checker circuit 250 is provided in a digital sensor IC (e.g., IC 10" of FIG. 1B), sample circuits 256, 258 may comprise a digital register or other suitable digital storage.

Window comparator 270 can be the same as or similar to window comparator 220 (FIG. 2) and is configured to compare the sampled signals 264, 268 and to generate fault signal 272 to indicate a fault if the signals 264, 268 differ by more than a predetermined amount, which here again may take the form of a predetermined absolute amount or a predetermined percentage as examples. Fault signal 272 which can be the same as or similar to fault signal 222 can take various forms.

As noted above in connection with FIG. 1B, each processing channel 16", 18" may include a different (i.e., non-homogenous) type of ADC 26a, 26b. The particular ADC type selected for each processing channel is based on at least the accuracy and speed of the ADC in order to meet the application requirements for the primary and secondary channels 16", 18".

Referring to FIG. 3, an example ADC 300 in the form of a second order sigma-delta converter may provide ADC 26a (FIG. 1B). ADC 300 includes a forward path containing summation elements (e.g., differential amplifier) 306, 314, integrators 310, 318, and a quantizer 322 generating a digital output signal 326. A first feedback path from the digital output signal 326 to the first summation element 306 includes a digital-to-analog converter (DAC) 330 and a gain stage (i.e., feedback coefficient) 334. A second feedback path from the digital output signal 326 to the second summation element 314 includes DAC 330 and a feedback coefficient 332, as shown.

By operation of the ADC 300, the digital output signal 326 has a value proportional to the level of the analog input signal 302. In an embodiment in which the sigma-delta ADC 300 of FIG. 3 provides the ADC 26a of FIG. 1B, the ADC input signal 302 can correspond to the output of amplifier 22a" and the digital output signal 326 of the ADC provides the digital input signal to the primary digital signal path 24".

Referring to FIG. 3A, an example ADC 350 in the form of a dual-slope converter may provide ADC 26b (FIG. 1B). ADC 350 includes a switch 358 configured to selectively couple an analog input voltage 352 or a reference voltage (of opposite polarity to the input voltage) 354 to an integrator under the control of a control signal 360. The integrator includes an operational amplifier 368, resistor 364, and capacitor 372. A switch 376 coupled in parallel with the capacitor 372 periodically resets the capacitor voltage under the control of a control signal 378. The output of amplifier 368 is coupled to an input of a comparator 380, which comparator has a second input coupled to a reference voltage 382 as may form a zero crossing detector to provide a comparator output signal 390 to a controller 392. Controller 392 is responsive to the comparator output signal 390 and generates the switch control signals 360, 378 and ADC output signal 394. Control signal 360 causes switch 358 to couple the analog input voltage 352 to the integrator for a fixed time, following which the control signal 360 causes the switch 358 to couple the reference voltage 354 to the integrator. A transition of the comparator output signal 390 indicates that the capacitor voltage has returned to zero and the time it takes for the output of the integrator 368 to return to zero is measured by the ADC controller 392 to provide digital output signal 394 having a value proportional to the level of the analog input voltage 352.

It will be appreciated that the sigma-delta ADC 300 of FIG. 3 and the dual-slope ADC 350 of FIG. 3A can be designed to achieve a desired speed and/or accuracy for the respective processing channel in which the ADCs are used. Non-homogeneity is achieved simply by using different types of ADCs in the two processing channels (e.g., channels 16", 18" of FIG. 1B). Additional non-homogeneity can be achieved by design choices selected to provide different accuracies (e.g., resolutions) and/or different conversion speeds.

As explained above in connection with FIG. 1B, each of the digital signal paths 24a", 24b" may implement a different sensing methodology to process the input digital magnetic field signal samples and generate a respective processed signal 30a", 30b". For example, in angle sensor embodiments, in which both digital signal paths process a sensed magnetic field to generate an angle measurement signal, each may do so according to a different sensing methodology.

Figure 4:
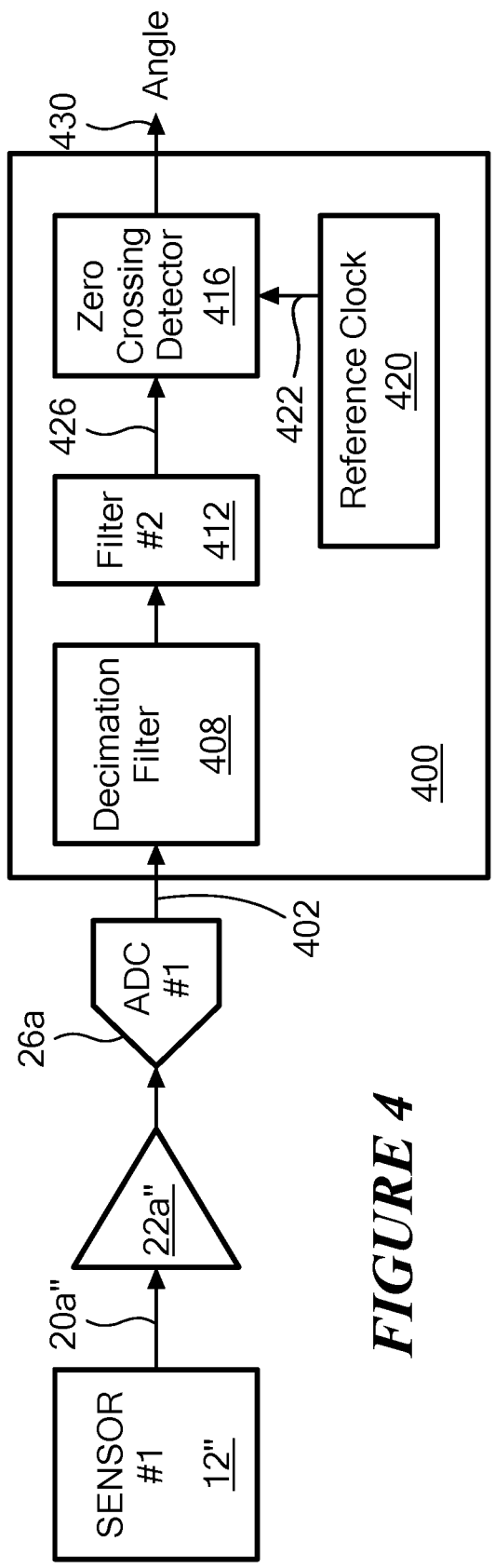
FIG. 4 is a block diagram of an example digital signal path.

Referring to FIG. 4, one such angle sensing methodology can be achieved with digital signal path 400 (which path may provide digital signal path 24a" of FIG. 1B). In this embodiment, sensor 12" can be a CVH element providing magnetic field signal 20" to amplifier 22a", the output of which is converted into a digital signal 402 by ADC 26a (FIG. 1B).

The digital signal path 400 may include a decimation filter 408, a further filter 412, a zero crossing detector 416, and a reference clock generator 420. Digital signal path 400 is responsive to the digital input signal 402 which represents a digitized version of the substantially sinusoidal output of the CVH sensor 12". The digitized signal 402 is filtered by filters 408 and 412 and the filtered signal 426 is coupled to zero crossing detector 416. In response to a reference signal 422 from reference clock generator 420, the zero crossing detector 416 determines when the filtered signal 426 crosses the zero reference point. Since phase shift between transitions of the zero crossing detector and the reference signal 422 are proportional to the magnetic field angle, the output signal 430 of the zero crossing detector 416 thus, is indicative of the angle of the sensed magnetic field.

Figure 4A:
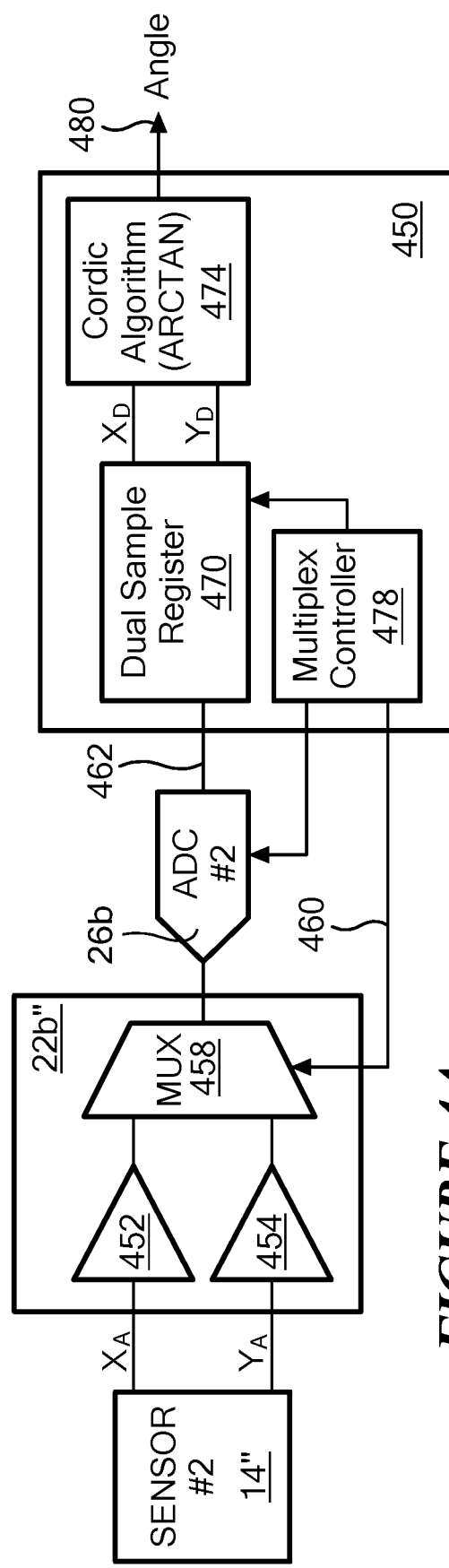
FIG. 4A is a block diagram of an alternative digital signal path.

Referring to FIG. 4A, an alternative angle sensing methodology can be achieved with digital signal path 450 (which path may provide digital signal path 24b" of FIG. 1B). In this embodiment, sensor 14" can include a dual vertical Hall effect configuration providing analog magnetic field signals $X_A$, $Y_A$ (collectively signals 20b", FIG. 1B) to an amplifier circuit (collectively amplifier 22b", FIG. 1B). In this example, the sensor 14" may include a pair of Hall effect elements positioned orthogonally with respect to each other such that an output signal $X_A$ of one of the elements represents the magnetic field as sensed with respect to a first, x-axis and an output signal $Y_A$ of the other element represents the magnetic field as sensed with respect to a second, orthogonal, y-axis. Amplifier circuit 22b" includes an amplifier 452 coupled to the first sensor output signal $X_A$, an amplifier 454 coupled to the second sensor output signal $Y_A$, and a multiplexer 458 that selectively couples one of the amplifier output signals to the digital signal path 450 under control of control signal 460. The output of amplifier circuit 22b" is converted into a digital signal 462 by ADC 26b (FIG. 1B).

Digital signal path 450 can include a dual sample register 470, a CORDIC processor 474, and a multiplexer controller 478. Multiplexer controller 478 applies control signals to the multiplexer 458, the ADC 26b, and the dual sample register 479 in order to synchronize operation of the ADC 26b and the dual sample register 470 to thereby generate quadrature digital signals $X_D$, $Y_D$ representing digitized samples of respective analog magnetic field signals $X_A$, $Y_A$. Having generated quadrature signals $X_D$, $Y_D$, the CORDIC processor 474 computes the arctangent of the quadrature signals $X_D$, $Y_D$ in order to thereby generate a channel output signal 480 having a value indicative of the angle of the sensed magnetic field.

It will be appreciated that at least due to the time multiplexing associated with the digital signal path 450 of FIG. 4A, this digital signal path 450 can be slower than the angle sensing performed by the digital signal path 400 of FIG. 4. This slower processing can be sufficient for use in the secondary processing channel 18" (FIG. 1B) in order to thereby achieve non-homogenous redundancy, as long as the angle sensing by the path 450 is fast enough to meet the fault tolerant time requirement.

Figure 5:
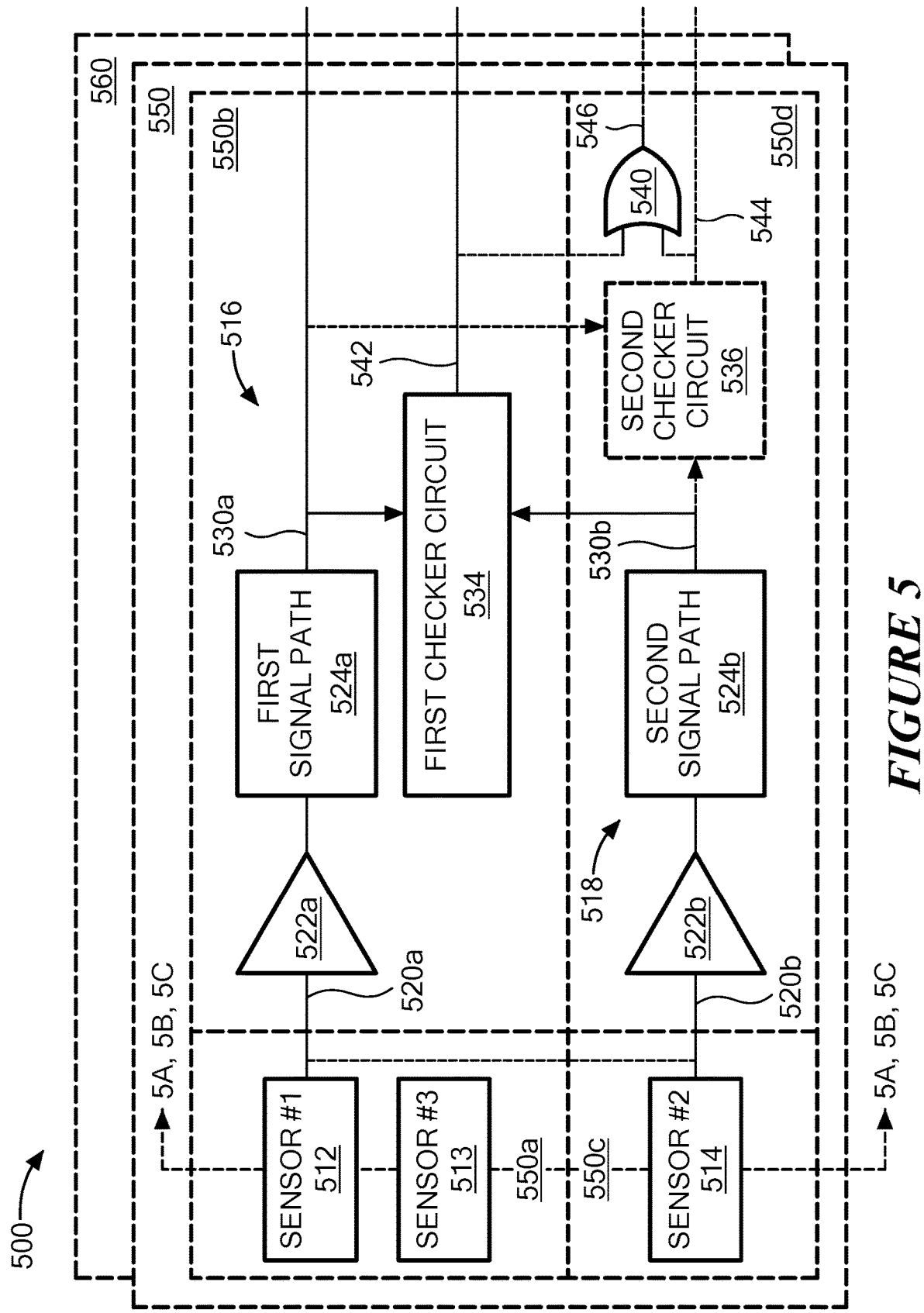
FIG. 5 is a block diagram of an alternative sensor integrated circuit.

Referring to FIG. 5, an embodiment of a sensor integrated circuit (IC) 500 is shown. This embodiment, like the sensor IC illustrated in FIG. 1, can have two or more processing channels 516, 518 which can include but is not limited to any processing channel described herein. In particular, the sensor IC 500 includes a first processing channel 516 responsive to the first analog signal 520a to generate with a first accuracy a first processed signal 530a, and a second processing channel 518 responsive to a second analog signal 520b to generate with a second accuracy a second processed signal 530b. The second accuracy of the second processing channel 518 can be different than the first accuracy of the first processing channel 516. The sensor IC 500 can also include a checker circuit, or error detector 534 such as any checker circuit described herein.

The first and second processing channels 516, 518 can be designed to sense an external parameter by processing analog signals 520a, 520b to provide a respective processed signal 530a, 530b indicative of the sensed parameter. In an alternative embodiment, when the sensors 512, 513, 514 provide digital output, such as those digital signals output by a pressure sensor switch or optical switch, the signals 520a, 520b can be digital signals. In some instances, the processed signals 530a, 530b differing from each other by more than a predetermined amount (as determined by the checker circuit 534) indicates a fault has occurred within the sensor IC 500. A high level of safety standard compliance can be achieved by using two unique (i.e., non-homogenous) processing channels 516, 518 and a checker circuit 534 to compare the outputs of the two channels. The processing channels 516, 518 can contain any non-homogeneities described herein.

Each processing channel 516, 518 includes at least a respective signal path, such as first signal path 524a in processing channel 516 and second signal path 524b in the second processing channel 518. Processing channels 516, 518 may additionally include a respective amplifier 522a, 522b, as shown.

Each processing channel 516, 518 is responsive to an analog signal that is generated by a sensing element or a plurality of sensing elements, here illustrated as sensors 512, 514. In some embodiments, each processing channel 516, 518 is responsive to a respective analog signal 520a, 520b generated by a respective sensor 512, 514 and, in other embodiments, each processing channel 516, 518 is responsive to the same analog signal (e.g., signal 520a) generated by the same sensor 512. Although FIG. 5 illustrates two sensing elements 512, 514, the sensor IC 500 can include three sensing elements as shown by the optional third sensor 513. This optional third sensor 513 outputs an analog signal that can be processed in a third processing channel (not shown), or in one of the existing processing channels 516, 518.

The sensors 512, 513, 514 can be any sensor described herein and can include one or more sensing elements that sense an external parameter such as pressure, light or the number of photons incident on a surface. The sensor IC 500 can be a part of any of the following sensor classes: gas sensor, load sensor, detection sensor, accelerometer, gyroscope or biological sensor. Although the sensor classes provide different functionalities, the sensor IC 500 may utilize some or all of the structures and methods described herein, or utilize the structures and methods described herein together with additional sensing technologies. For example, the sensors 512, 513, 514 could be included in a LIDAR or LADAR system.

In some instances, the sensors 512, 513, 514 can comprise any of the magnetic field sensing elements described herein. In other instance, the sensors 512, 513, 514 can include a photodiode, photo transistor, or any other material able to convert photons into an electrical signal. The sensors 512, 513, 514 can also include a piezoelectric sensor, magnetic-based pressure sensor, transistor-based pressure sensor, or a capacitive or resistive-based pressure sensor. In each instance, the sensor 512, 513, 514 is configured to sense pressure or a mechanical stress and convert the sensed parameter into an electrical signal. The configuration of the sensors 512, 513, 514 are described in more detail below in FIGS. 5A-5C.

The above-described arrangements can be provided with various options in order to suit a particular application and/or safety requirements. Optional elements and connections are illustrated in the figures by certain dotted line connections and element outlines.

Like the sensor IC 10 described in FIG. 1, the sensor IC 500 can generate one or more output signals that can be provided to external circuits and systems for further processing or action. In some embodiments, the fault signal 542 from the checker circuit 534 may be combined with the first and/or second processed signals 530a, 530b in order to provide a "composite" output signal, or signals that conveys information about the parameter sensed by the sensor IC 500 as well as fault information.

In some embodiments, the sensor IC 500 additionally includes a second checker circuit 536. The second checker circuit 536, like the first checker circuit 534, is responsive to the first processed signal 530*a* and the second processed signal 530*b* and is configured to detect a fault in the sensor IC 500 when the first processed signal 530*a* and the second processed signal 530*b* differ from each other by more than a predetermined amount. The fault signal 544 generated by the second checker circuit 536 can be provided as an output signal of the IC 500 to external circuits and/or systems.

The sensor IC 500 can also be configured to use both the first and second checker circuits 534, 536 such that the fault signals 542, 544 generated by each checker circuit can be coupled to a logic circuit (here, logic or gate 540) to thereby generate a fault signal 546 indicative of a fault in the sensor IC 500 when either fault signal 542 or fault signal 544 indicates a fault condition in the sensor IC 500. In such embodiments, the output signal 546 of logic circuit 540 can be provided as a further (or alternative) output signal of the IC 500 to external circuits and/or systems. Furthermore, the first and second checker circuits 534, 536 can be identical or can be non-homogenous checker circuits.

The sensor(s) 512, 513, 514 can form part of (i.e., be integrated with or internal to) the sensor IC 500 or, alternatively, can be external to the sensor IC 500. When one or more of the sensor(s) 512, 513, 514 are located external to the sensor IC 500, the external sensor can be electrically connected to the sensor IC 500 via a lead or wire that permits the sensor IC 500 to receive sensor information from the external sensor. The sensor IC 500 includes one or more semiconductor die that support the electronic circuitry, a lead frame having a plurality of leads through which electrical connections can be made to the IC circuitry from outside of the IC and may optionally include additional discrete components. Portions of the IC 500, including at least the semiconductor die and a portion of the lead frame, are enclosed by a non-conductive mold material that forms the IC package, while other portions (such as an opening for pressure to reach the pressure sensing element, or light to reach an optical sensing element) are not enclosed by the mold material and permit access to connection points within the IC. Other portions of the sensor IC 500 can have external lead portions that permit the electrical and/or mechanical connection of the sensor IC 500 to another circuit element which may include but is not limited to a computer, circuit board or a wiring harness or housing. The IC package can be configured as a "die-up" package in which the die is attached to the lead frame with its active surface opposite to the lead frame, a "flip-chip" package in which the die is attached to the lead frame with its active surface facing the lead frame, or a "lead-on-chip" package in which the lead frame is positioned above the die, or a lead-on-chip package where the active surface of the die is on the bottom surface of the lead frame and an electrical connection can be made from the active, or top surface of the die to the top surface of the lead frame.

Dotted line boxes 550, 550*b*, 550*c*, and 550*d*, and 560 represent possible individual semiconductor die within the sensor IC package. The sensor(s) 512, 513, 514 may be internal to the sensor IC 500 or, alternatively, may be external to the IC. For example, an external sensor can include a pressure sensor formed on a PC board, or a hybrid circuit substrate, including but not limited to an alumina substrate, where the external sensor is connected to the sensor IC 500. Many variations are possible in terms of partitioning of the described circuitry on one or more die and which variation is adopted generally will be based on safety requirements and space and cost considerations.

For example, the sensor IC 500 can include a first sensor 512 that can be integrated onto one semiconductor die (i.e., a semiconductor die comprising the portions labeled 550*a*, 550*b* and 550*d*) together with circuitry within the IC 500, and a second sensor 514 that can be supported by a separate semiconductor die like the semiconductor die labeled 550*c*. In this example, the second sensor 514 can be wire-bonded, flip-chip connected, or otherwise communicatively and electrically connected to the semiconductor die structure comprised of the portions labeled 550*a*, 550*b* and 550*d*.

In still another example, the sensor IC 500 can include first and second sensors 512, 514 and each sensor 512, 514 can be supported by a separate semiconductor die 550*a* and 550*c*, respectively. Additional circuitry within the sensor IC 500 can be supported by a semiconductor die comprising portions labeled 550*b* and 550*d*. The sensors 512, 514 can communicate with the IC circuitry via an electrical connection.

The semiconductor die of the sensor IC 500 can be referred to more generally as substrate(s) as they may include one or more layers or sub-layers in which the active element and other features of the sensor IC 500 can be formed. The substrates can include a silicon-on-insulator (SOI) wafer, a silicon wafer, a glass wafer, or any other suitable wafer or substrate type. A laser ablation process, a deep reactive ion etching (DRIE) process, or a wet etching process can be used to form features of the sensor IC 500 including cavities in the wafer such as those used in pressure sensors. In some instances where a silicon wafer or SOI wafer is used, features of the sensor IC 500 can be formed using an anisotropic silicon wet etch process.

Figure 5A:
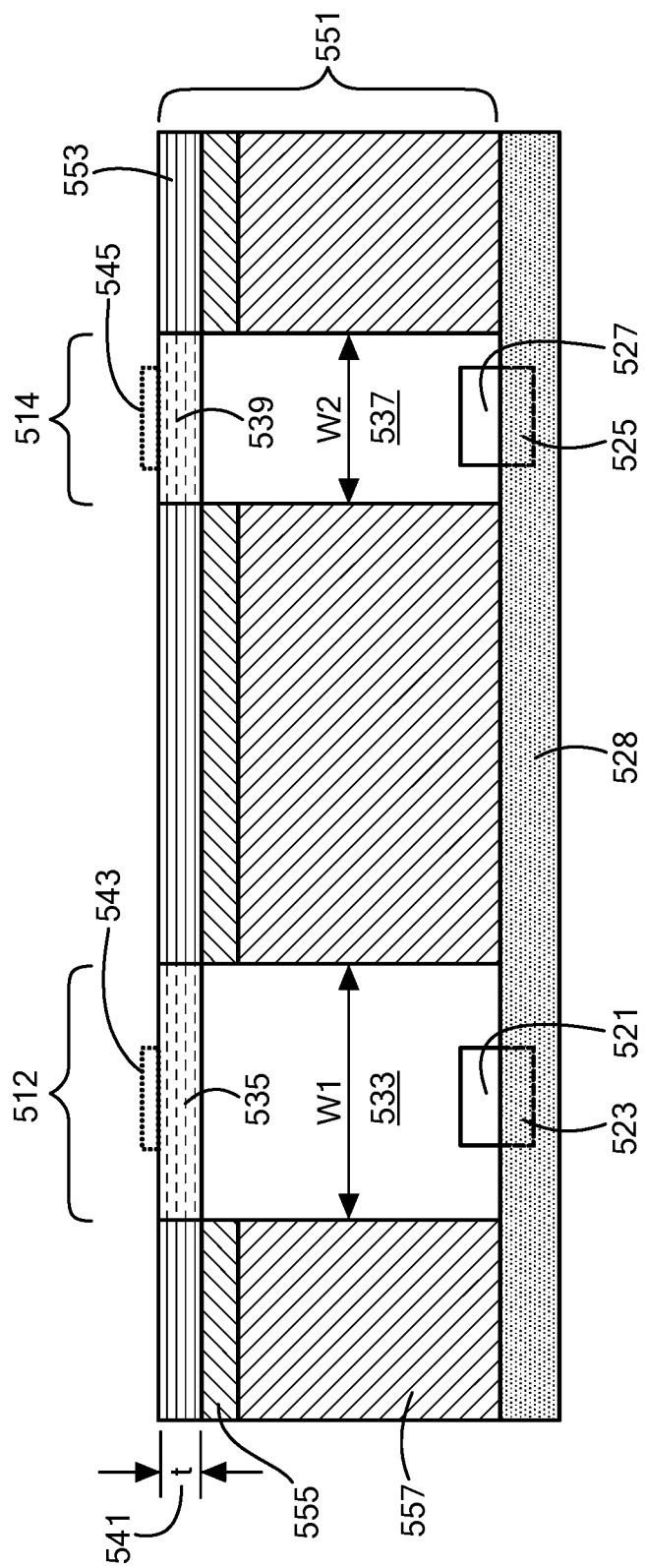
FIGS. 5A-5C are cross-sectional views of embodiments of the sensor integrated circuit of FIG. 5.
Figure 5B:
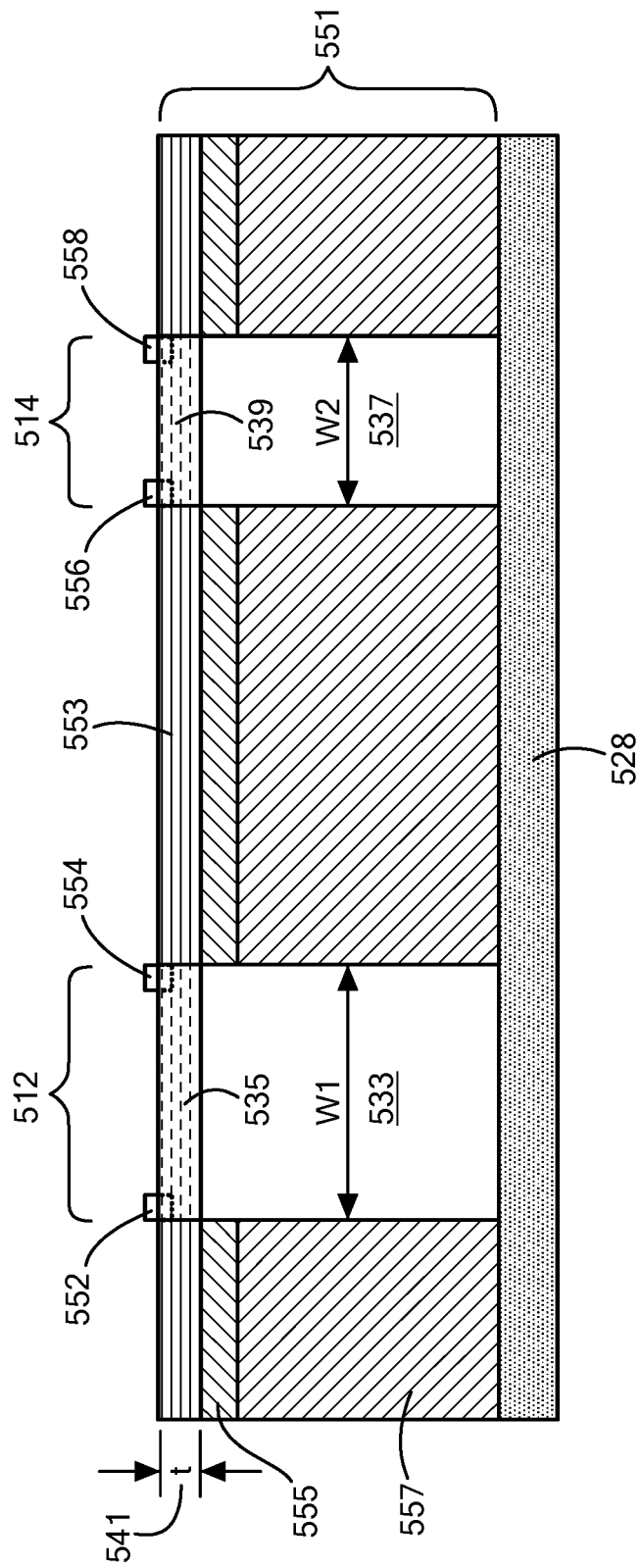
Figure 5C:
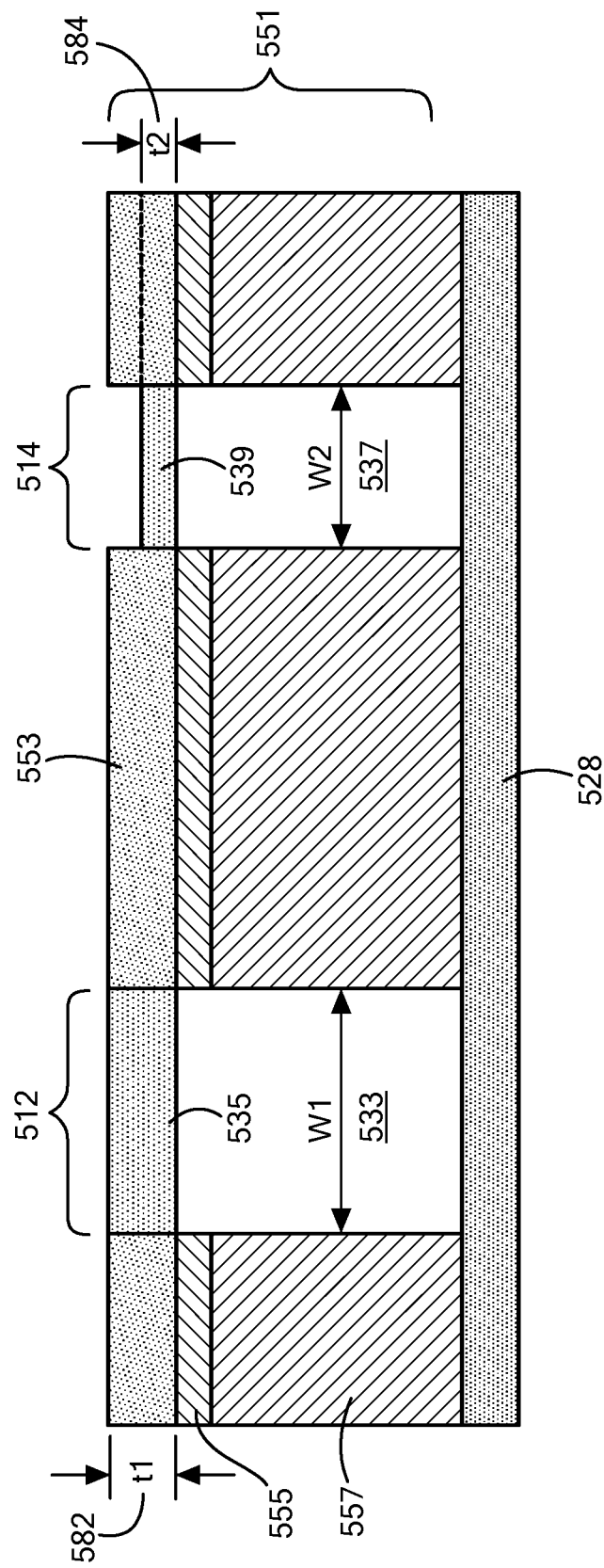

The sensor IC 500 can include multiple sub-layers, layers, die or substrates formed using standard, non-standard, post-processing or any other manufacturing technique used at the wafer-level to grow, deposit or adhere one such structure to another. Referring to FIGS. 5A, 5B and 5C, illustrated are cross-sectional views of the sensor IC 500 showing various example layers within the sensor IC 500. Included in the sensor IC 500 is a second wafer 528 that has opposite surfaces. The bottom surface of the second wafer 528 may be bonded to a handle wafer 557 that can be referred to as a wafer, handle or handle wafer. The handle wafer 557 is part of the SOI wafer 551 in sensor IC 500, where the SOI wafer 551 includes a device layer 553 attached to an insulating layer 555 which is attached to the handle wafer 557. The SOI wafer 551 and the second wafer 528 can be bonded in wafer form and separated into die or cut and bonded in die form. In some instances, a lead frame can be used in lieu of the second wafer 528 such that the SOI wafer 551 is bonded to the lead frame. In these instances, the lead frame can be formed from copper or a similar material suitable for use as a lead frame within a semiconductor package.

The insulating layer 555 that can be referred to as an insulator and can comprise one or multiple layers of insulating material such as silicon dioxide or silicon oxide. The insulating layer 555 can be disposed between the handle wafer 557 and a device layer 553. Various electrical components illustrated in FIG. 5 can be formed in the device layer 553. In some instances, the device layer 553 can be an active layer comprising prime quality silicon.

Referring now to FIG. 5A, sensor membranes 535, 539 may be fabricated in the device layer 553 to form a membrane or diaphragm which may be used as a pressure sensor.

These sensor membranes 535, 539 can be fabricated using complementary metal-oxide-semiconductor (CMOS) or semiconductor process layers. In some instances, the sensor membranes 535, 539 can be formed by etching through the backside of a corresponding silicon-on-insulator (SOI) wafer. This etching can be the result of deep reactive ion etching (DRIE) that uses a high-aspect-ratio DRIE, or any similar process that can be performed on the SOI wafer. In other instances, the sensor membranes 535, 539 can be formed using a potassium-hydroxide (KOH) wet etch or other type of isotropic wet etch process, i.e., wet etch using an aqueous solution of ethylene diamine and pyrocatechol (EDP), or tetramethyl, ammonium hydroxide (TMAH). When dry etching is used, such as DRIE, the SOI wafer 551 can be a silicon wafer, a glass substrate or other type of wafer. In still other instances, the sensor membranes 535, 539 can be created using surface micromachining and bulk micromachining processes. Additionally, the sensor membranes 535, 539 can be a material other than silicon, for example silicon dioxide, silicon oxide or silicon nitride, and can be formed on a silicon sacrificial layer which can be etched using xenon difluoride. In still other instances, the sensor membranes 535, 539 can be formed from a polymer.

The sensors 512, 514 can include cavities 533, 537 formed between the sensor membranes 535, 539 and the second wafer 528. The first sensor 512 can have a cavity 533 formed between the sensor membrane 535 and the second wafer 528, and the second sensor 514 can have a cavity 537 formed between the sensor membrane 539 and the wafer 528.

Pressure sensor 512 can be formed by measuring a change in capacitance between electrode 521 on the second wafer 528 and electrode 543 on the membrane 535. Pressure sensor 514 can be formed by measuring a change in capacitance between electrode 527 on the second wafer 528 and electrode 545 on the membrane 539. In embodiments where the second wafer 528 is a lead frame 528 or comprises lead-frame material, the electrodes 521, 527 may be formed on a surface of the lead frame 528 or may be the lead frame 528 itself. In these embodiments, the electrodes 521, 527 can be formed from the same portion of the lead frame 528 such that they have the same or near same electrical potential, while in other embodiments the electrodes 521, 527 can be formed from different lead frame 528 portions such that the electrodes 521, 527 are electrically isolated from each other, such as with a different die paddle.

The cavities 533, 537 have characteristic width, W1 and W2 respectively. The sensor diaphragms 535, 539 have widths that correspond to the characteristic width of each diaphragm's respective cavity 533, 537. Varying the width of each sensor 512, 514, and therefore the width of each diaphragm 535, 539 can alter the resolution or sensitivity of each sensor 512, 514 such that the sensors 512, 514 sense an exerted pressure at different levels of sensitivity. It should be appreciated that a width in the context of this sensor IC 500 can be a diameter, size or other measurement across the middle of a shape.

The larger the width of the cavity 533, 537, the more sensitive the sensor 512, 514 is to deformations in diaphragm 535, 539. For example, the characteristic width (W1) of the first sensor 512 is larger than the characteristic width (W2) of the second sensor 514. Therefore, the sensitivity of the first sensor 512 is greater than the sensitivity of the second sensor 514 and therefore greater than the second-sensor pressure range. Diaphragm sensitivity is inversely proportional to the stiffness of the sensor membranes 535, 539. As the width of a sensor 512, 514 decreases, the stiffness of the sensor membranes 535, 539 increases thereby causing the sensor membranes 535, 539 to be less susceptible to movement or deflection caused by pressure, and to output a sensed pressure with less resolution. As the width of a sensor 512, 514 increases, the stiffness of the sensor membranes 535, 539 decreases thereby causing the sensor membranes 535, 539 to be more susceptible to movement or deflection caused by pressure, and to output a sensed pressure with high resolution. In some instances, the diaphragms or membranes 535, 539 can have a substantially circular shape such that the widths W1 and W2 represent a diameter of the membranes 535, 539. Other membrane shapes may also be formed without departing from the present invention. Circular membranes may be more easily formed in a silicon wafer by a process such as a DRIE process.

The sensors 512, 514 can include an additional or alternative sensing element (herein referred to as a secondary sensing element) in place of the electrode 543, 545 that can provide alternative or additional sensing capabilities. In some instances, this alternative or secondary sensing element can be a Hall plate, magnetoresistive element, or other magnetic field sensing element that is installed on the sensor membranes 535, 539 to sense a deflection of each membrane or diaphragm 535, 539 using the magnetoresistive effect, Hall effect or the piezo Hall effect. When the membranes or diaphragms 535, 539 deflect or move, the signal from the magnetic field sensors 543, 545 change and the amount of change can be a measure of the applied pressure to the membrane. Permanent magnets 521, 527 may be deposited at the bottom of each cavity 533, 537 such that the permanent magnets 521, 527 are positioned on the surface of the second wafer 528, or partially embedded in the wafer 528 such that a portion of the magnets 523, 525 are below the surface of the second wafer 528. In another embodiment a magnet can be positioned as at least one magnet, or coil, or other magnetic field source behind the lead frame or wafer 528. In some instances, the magnetic source is placed above the membranes 535, 539.

In other embodiments the one or more electrodes 521, 527, may be magnetic field sensing elements which can be Hall effect, or magneto resistive sensing elements. In these embodiments, the sensor IC 500 can include a permanent magnet, back bias magnet or coil to generate a magnetic field. For example, a permanent magnet can be printed or otherwise disposed on the surface of each sensor membrane 535, 539 to provide a back bias field. Additionally, a magnet can be mounted on or below a lead frame supporting the sensor IC 500 or included in the sensor IC 500 packaging to provide a back bias field. In such a case a soft ferromagnetic material may be deposited on the membranes 535, 539 to allow for a magnetic flux change to be measured by the magnetic field sensing elements 521, 527. In instances where magnetic sensing elements 521, 527 and magnets or ferromagnetic materials are used, the pressure can be sensed when a magnet or magnetic material affixed to the sensor membrane 535, 539 is moved by pressure thereby altering a magnetic field associated with the magnetic sensing elements 521, 527.

Many applications such as those implementing automotive safety integrity level (ASIL) requirements in self-driving, autonomous or semi-autonomous vehicles require optical sensors. In these applications, the sensors 512, 514 can include an optical sensing material. Lenses either affixed to the sensors 512, 514 or used in conjunction with the sensor IC 500 can be used to alter an amount or number of photons absorbed by each sensor 512, 514 thereby altering the sensing resolution of each sensor 512, 514. Alternatively, a first sensor 512 can have a larger width or sensing area than the second sensor 514 and therefore absorb a greater number of photons.

In other embodiments optical sensor 512 may be on the same substrate or die as the electronics, for example 550B and 550d of FIG. 5, and optical sensor 514 may be on another die made of a different material, for example but not limited to GaAs.

There are multiple ways to alter the pressure sensing range including varying the thickness of the sensor membranes 535, 539, varying the material of the sensor membranes 535, 539, varying the diameter or width of the diaphragms 535, 539, or embossing or adding shapes or features to the sensor membranes 535, 539. Some of these methods are discussed below in conjunction with FIG. 5C.

As with the embodiment depicted in FIG. 5A, the sensor 500 shown in FIG. 5B has two sensors 512, 514 that comprise a diaphragm 535, 539 and a sensor cavity 533, 537 bound by the sensor membrane 535, 539 and the wafer or lead frame 528. Each sensor cavity 533, 537 has a characteristic width, W1 and W2, that dictates the stiffness of the diaphragm and therefore the sensitivity of the sensor 512, 514.

The sensors 512, 514 of FIG. 5B include multiple piezoelectric sensors that can comprise piezoresistors, piezotransistors or any other type of piezoelectric sensor. In an embodiment, each sensor 512, 514 can include a pair of piezoelectric sensors positioned either on the surface or embedded in the surface of the diaphragm 535, 539. For example, the first sensor 512 can include one piezoelectric sensor 552 installed on one side of its diaphragm 535 and a second piezoelectric sensor 554 installed on the opposite side of its diaphragm 535. Similarly, the second sensor 514 can include one piezoelectric sensor 556 installed on one side of its diaphragm 539 and a second piezoelectric sensor 558 installed on the opposite side of its diaphragm 539. These piezoelectric sensors 552, 554, 556, 558 change their properties, such as resistance, when pressure or mechanical stress is applied to each diaphragm 535, 539. For the case of a piezoresistor, the resistor may have a known current through it such that a change in the resistance may be measure as a change in voltage by an electrical circuit. In other embodiments a constant voltage applied to the resistor could results in a change of the current which would could be detected by an electrical circuit. In one case the change in current through the piezo resistor may be sensed as a voltage on a sense resistor in another part of an electrical circuit. In some instances, the piezoelectric sensors 552, 554, 556, 558 can be installed on a surface of the diaphragms 535, 539. In other instances, the piezoelectric sensors 552, 554, 556, 558 can be embedded into a surface of the diaphragms 535, 539 such that a portion of the piezoelectric sensors 552, 554, 556, 558 are enclosed within the diaphragm 535, 539.

Structural arms (not shown) or features, can extend from either side of the cavity wall such that each sensor 512, 514 has two structural arms extending from either side of the cavity wall towards the center of the sensor cavity 533, 537. In this embodiment, the cavity wall can comprise portions of the insulating layer 557 or device layer 553. The piezoelectric sensors 552, 554, 556, 558 are installed on the structural arms to sense an amount of pressure applied to the sensor membranes 535, 539. The mechanical stress or pressure applied to the sensor membranes 535, 539 can be concentrated in the structural arms, therefore installing the piezoelectric sensors 552, 554, 556, 558 on the structural arm increases the resolution of the sensor output.

In some instances, a dummy piezoelectric sensor can be installed on portions of the substrate or semiconductor die. This dummy sensor can be used in conjunction with a Wheatstone bridge to perform temperature compensation.

Illustrated in FIG. 5C is a sensor IC 500 that has sensor membranes 535, 539 with varying thicknesses, t1 582 and t2 584, respectively. In some cases, an additional etch of depth t1 582 may be performed to thin membrane 539 to the thickness of t2 584. Etching the sensor membrane 539 to a depth of t1 582 causes the first sensor membrane 535 to be thicker than the second sensor membrane 539, i.e., the value of t1 582 is greater than the value of t2 584, such that the first sensor membrane 535 has the same thickness, t1 582, as the device layer 533 and the second sensor membrane 539 has a smaller thickness, t2 584, than that of the device layer 533. Although FIG. 5C illustrates a thicker first membrane 535 and thinner second membrane 539, it should be appreciated that other embodiments can include a thinner first membrane 535 and thicker second membrane 539. Additionally, both membranes 535 and 539 may be etched to each have a different thickness than the device layer 533 to further control performance of the sensors 512, 514. The sensor membranes 535, 539 can be etched using any etching method described herein.

In some instances, an additional layer can be fabricated or installed on top of a first sensor 512 or both sensors 512 and 514 so that the thickness, t1 582, of the first sensor membrane 535 is thicker than the membrane 539 of the second sensor 514. In this embodiment the second sensor 514 lacks an additional membrane and therefore has a membrane thickness of t2 584. The additional membrane material can be a polysilicon, silicon dioxide, silicon oxide, or other material to change the mechanical properties of the diaphragm or membranes 535, 539. In another embodiment both membranes 535 and 539 may have material added to them. These added materials may be the same or different material on the two membranes 535 and 539. In some cases, the membranes 535, 539 may be unetched and have the thickness of the device layer 553. In other embodiments the membranes may be formed of added materials on top of the wafer material 535, 539 and the material, for example silicon, of 535, 539 may be removed.

The sensors 512, 514 illustrated in FIGS. 5A-5C have different sensing resolutions that result in non-homogenous processing channels 516, 518 with different processing accuracies. These non-homogenous processing channels 516, 518 can be created by varying aspects of the sensors 512, 514 or varying other aspects of the system within the sensor IC 500 such as the layout, connections between circuit elements, less accurate gain stages, a lower count analog-to-digital converter, or different sized semiconductor dies.

In some cases, the power supplied to the sensors may be modified to create differences between sensors 512, 514. For example, operation of the sensors 512, 514 can be altered by varying the amount of current or voltage supplied to each sensor 512, 514. Providing one sensor with a higher current or power can increase the sensing resolution relative to the other sensor. Likewise, in some sensors changing the voltage supplied to the sensing elements changes the performance of the sensing elements.

In another instance, each sensor 512, 514 can comprise a different type of sensing material. For example, one sensor 512, 514 may comprise a semiconductor-based channel or sensor such as GaAs, InGaAs, or other compound semiconductor material, while the other sensor 512, 514 comprises a silicon-based sensor. In other instances, sensors 512, 514 may not be electrically connected on the die, or may be formed on different die where electrical connection such as wire bonds, solder bumps, pillar bumps or any other electrical connecting material may be used to connect the sensing elements to the circuitry 550b, 550d of FIG. 5. In still other instances, the separate sensor element can reside on a second die. Additionally, one optical sensor may include a polysilicon layer as the sensing layer while the other optical sensor can use a single crystal silicon layer. In this example, the sensor that uses the single crystal silicon layer may be more responsive to certain wavelengths of light and therefore have a higher resolution than the sensor with the polysilicon layer. The polysilicon optical sensor may also be able to be formed on top of other circuitry and therefore reduce total die area.

As discussed above, the sensor IC 500 can be segmented such that aspects of the sensor IC 500 can reside on one semiconductor die while other aspects of the sensor IC 500 reside on a second, separate semiconductor die. When the sensors 512, 514 comprise silicon sensing elements, said elements can reside on the same semiconductor die as the circuitry of the sensor IC 500. In other instances, each sensor 512, 514 and the circuitry can reside on a separate die.

The sensors 512, 514 illustrated in FIGS. 5A-5C differ with regard to their sensing resolution, therefore when used in their respective processing channel 516, 518, the channels are non-homogenous processing channels 516, 518 with different processing accuracies. These non-homogenous processing channels 516, 518 can be leveraged to provide both sensing and fault detection capabilities. In particular, the processing channel 516, 518 with the more accurate sensor 512, 514 can be used to provide accurate sensor output, while the less accurate sensor 512, 514 can be used to check the output of the more accurate sensor. The checker circuit 534 uses the output of the less accurate sensor to check the output of the more accurate sensor. In another instance, the pressure required to deflect the one of the sensor membranes 535, 537 occurs at a lower pressure level, therefore the less accurate sensor 512, 514 can be used as a digital switch to switch an electrical signal when the pressure rises above a certain threshold.

In embodiments where three sensors 512, 513, 514 are included within the sensor IC 500, three sensed values can be used to output an actual sensed pressure value, check whether a sensed pressure value exceeds a high pressure threshold, and check whether another sensed pressure value falls below a low pressure threshold. In these embodiments, the checker circuit 534 and the second checker circuit 536 can be configured to use a common input wire or circuit to check the output of the actual sensed pressure value and determine whether it is within both the high and low pressure thresholds. In another instance, one of the sensors can be used to output an actual sensed pressure value while the other two sensors can be used in a cascading fault detector that turns on certain checking circuits once a pressure threshold is reached. In another instance there could be three checker circuits.

All references cited herein are hereby incorporated herein by reference in their entirety.

Having described preferred embodiments, it will now become apparent to one of ordinary skill in the art that other embodiments incorporating their concepts may be used.

For example, it will be appreciated that while the sensor ICs of FIGS. 1, 1A, 1B and 5 are shown to have two processing channels, more than two processing channels could be used, if cost and space considerations permit.

It is felt therefore that these embodiments should not be limited to disclosed embodiments, but rather should be limited only by the spirit and scope of the appended claims.

What is claimed is:

1. A sensor integrated circuit comprising:
a substrate comprising a first cavity forming a first diaphragm that can be deformed by a pressure differential across the first diaphragm and a second cavity forming a second diaphragm that can be deformed by a pressure differential across the second diaphragm;
a first processing channel responsive to a first analog signal to generate a first processed signal, wherein the first analog signal is provided by a first sensing element positioned adjacent to the first diaphragm and configured to detect the pressure differential across the first diaphragm by detecting deformation of the first diaphragm;
a second processing channel responsive to a second analog signal to generate a second processed signal, wherein the second analog signal is provided by a second sensing element positioned adjacent to the second diaphragm and configured to detect the pressure differential across the second diaphragm by detecting deformation of the second diaphragm; and
a checker circuit responsive to the first processed signal and the second processed signal and configured to detect a fault in the sensor integrated circuit and generate a fault signal indicative of the fault when the first processed signal and the second processed signal differ from each other by more than a predetermined amount, wherein the checker circuit comprises a first sample circuit configured to sample the first processed signal and generate a first sampled signal, a second sample circuit configured to process the second processed signal and generate a second sampled signal, and a window comparator responsive to the first sampled signal and the second sampled signal and configured to generate the fault signal.

2. The sensor integrated circuit of claim 1, where the substrate comprises a semiconductor wafer, a silicon-on-insulator (SOI) wafer, or a silicon wafer.

3. The sensor integrated circuit of claim 1, where the substrate comprises a glass wafer.

4. The sensor integrated circuit of claim 1, wherein a width of the first diaphragm is larger than a width of the second diaphragm.

5. The sensor integrated circuit of claim 1, wherein a thickness of the first diaphragm is greater than a thickness of the second diaphragm.

6. The sensor integrated circuit of claim 1, wherein the first diaphragm comprises a first material and the second diaphragm comprises a second material different from the first material.

7. The sensor integrated circuit of claim 6, comprising a surface micromachined pressure sensor and a bulk micromachined pressure sensor.

8. The sensor integrated circuit of claim 1, comprising multiple pressure sensing elements, wherein the first cavity comprises a first pressure sensing element, and the second cavity comprises a second pressure sensing element.

9. The sensor integrated circuit of claim 8, wherein the first and second pressure sensing elements comprise magnetic field sensing elements and wherein a strength of a magnetic field detected by the first sensing element changes according to a deformation of the first diaphragm and a strength of a magnetic field detected by the second element changes according to a deformation of the second diaphragm.

10. The sensor integrated circuit of claim 9, further comprising a ferromagnetic material adjacent to the first diaphragm and second diaphragm.

11. The sensor integrated circuit of claim 10, further comprising one of a back-bias magnet, permanent magnet or coil adjacent to the magnetic field sensing elements.

12. The sensor integrated circuit of claim 8, wherein the first and second pressure sensing elements comprise capacitive sensing elements and wherein an amount of capacitance detected by the first sensing element changes according to a deformation of the first diaphragm and an amount of capacitance detected by the second element changes according to a deformation of the second diaphragm.

13. The sensor integrated circuit of claim 1, comprising multiple pressure sensing electrodes, wherein the first cavity comprises a first pair of pressure sensing electrodes, and the second cavity comprises a second pair of pressure sensing electrodes.

14. The sensor integrated circuit of claim 8 wherein the first and second pressure sensing elements comprise piezoelectric sensing elements and wherein an amount of voltage detected by the first sensing element changes according to a deformation of the first diaphragm and an amount of voltage detected by the second element changes according to a deformation of the second diaphragm.

15. The sensor integrated circuit of claim 14, wherein the piezoelectric sensors comprise one of piezoresistors or piezotransistors.

16. The sensor integrated circuit of claim 1, wherein a magnetic element is disposed in the first diaphragm and the second diaphragm.

17. The sensor integrated circuit of claim 16, wherein the magnetic element that comprises one of a hard ferromagnetic material or a soft ferromagnetic material.

18. The sensor integrated circuit of claim 1, wherein the first processing channel has a first accuracy and the second processing channel has a second accuracy different than the first accuracy.

19. The sensor integrated circuit of claim 1, wherein the substrate is further configured to support the first sensing element and the second sensing element.

20. The sensor integrated circuit of claim 1, wherein the substrate is further configured to support the first sensing element, and a second substrate separate from the substrate supporting the first sensing element, the second substrate configured to support the second sensing element.

21. The sensor integrated circuit of claim 20, wherein the substrate is configured to support the first processing channel, the second processing channel and the checker circuit.

22. The sensor integrated circuit of claim 1, wherein the substrate is formed either using at least one of a deep reactive ion etching process or an isotropic silicon wet etch process.

23. A sensor integrated circuit comprising:
a first processing channel responsive to a first analog signal to generate a first processed signal, wherein the first analog signal is provided by a first semiconductor structure configured to detect incident photons;
a second processing channel responsive to a second analog signal to generate a second processed signal, wherein the second analog signal is provided by a second semiconductor structure configured to detect incident photons; and
a checker circuit responsive to the first processed signal and the second processed signal and configured to detect a fault in the sensor integrated circuit and generate a fault signal indicative of the fault when the first processed signal and the second processed signal differ from each other by more than a predetermined amount, wherein the checker circuit comprises a first sample circuit configured to sample the first processed signal and generate a first sampled signal, a second sample circuit configured to process the second processed signal and generate a second sampled signal, and a window comparator responsive to the first sampled signal and the second sampled signal and configured to generate the fault signal.

24. The sensor integrated circuit of claim 23, wherein the first semiconductor structure comprises a first material and the second semiconductor structure comprises a second material, wherein the first material is different from the second material.

25. The sensor integrated circuit of claim 23, wherein the first semiconductor structure has a first surface area and the second semiconductor structure has a second surface area, wherein the first surface area is greater than the second surface area.

26. The sensor integrated circuit of claim 23, comprising a substrate configured to support the first semiconductor structure and the second semiconductor structure.

27. The sensor integrated circuit of claim 23, comprising a first substrate configured to support the first semiconductor structure, the first processing channel, the second processing channel and the checker circuit, and a second substrate configured to support the second semiconductor structure.

* * * * *

UNITED STATES PATENT AND TRADEMARK OFFICE
CERTIFICATE OF CORRECTION

PATENT NO. : 10,636,285 B2  
APPLICATION NO. : 16/695698  
DATED : April 28, 2020  
INVENTOR(S) : David Jamie Haas et al.

Page 1 of 1

It is certified that error appears in the above-identified patent and that said Letters Patent is hereby corrected as shown below:

In the Specification

Column 1, Line 26 delete "or magnetic" and replace with --or more magnetic--.

Column 4, Line 13 delete "analog-to digital" and replace with --analog-to-digital--.

Column 4, Line 15 delete "analog-to digital" and replace with --analog-to-digital--.

Column 5, Line 63 delete "of a an object" and replace with --of an object--.

Column 7, Line 64 delete "in provide" and replace with --to provide--.

Column 16, Line 46 delete "in other instance," and replace with --in other instances,--.

Column 17, Line 60 delete "550, 550b," and replace with --550, 550a, 550b,--.

Column 21, Line 5 delete "550B" and replace with --550b--.

Column 21, Line 42 delete "measure" and replace with --measured--.

Column 21, Line 44 delete "could results in" and replace with --could result in--.

Column 21, Line 44 delete "which would could" and replace with --which could--.

Signed and Sealed this  
Sixth Day of October, 2020

Andrei Iancu  
*Director of the United States Patent and Trademark Office*